United States Patent
Ikeda et al.

(10) Patent No.: US 10,372,278 B2
(45) Date of Patent: Aug. 6, 2019

(54) DISPLAY DEVICE AND DETECTION DEVICE

(71) Applicant: Japan Display Inc., Tokyo (JP)

(72) Inventors: Masanobu Ikeda, Tokyo (JP); Hayato Kurasawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 16 days.

(21) Appl. No.: 15/498,783

(22) Filed: Apr. 27, 2017

(65) Prior Publication Data

US 2017/0357345 A1    Dec. 14, 2017

(30) Foreign Application Priority Data

Jun. 10, 2016  (JP) ................. 2016-116341

(51) Int. Cl.
| | |
|---|---|
| G06F 3/045 | (2006.01) |
| G06F 3/041 | (2006.01) |
| G06F 3/044 | (2006.01) |
| H01L 27/32 | (2006.01) |

(52) U.S. Cl.
CPC ............ G06F 3/044 (2013.01); G06F 3/0412 (2013.01); H01L 27/323 (2013.01); H01L 27/3246 (2013.01); H01L 27/3276 (2013.01); *G06F 2203/04103* (2013.01); *G06F 2203/04108* (2013.01); *G06F 2203/04111* (2013.01)

(58) Field of Classification Search
CPC ....... G06F 3/044; G06F 3/0412; G06F 3/0416
See application file for complete search history.

(56) References Cited

U.S. PATENT DOCUMENTS

| | | | | |
|---|---|---|---|---|
| 2003/0128311 A1* | 7/2003 | Tsuda | ................ | G02F 1/133512 349/106 |
| 2012/0075237 A1* | 3/2012 | Ikeda | .................... | G06F 3/0412 345/174 |
| 2012/0268418 A1* | 10/2012 | Ishizaki | ................ | G06F 3/0412 345/174 |
| 2013/0093706 A1 | 4/2013 | Kurasawa et al. | | |

(Continued)

FOREIGN PATENT DOCUMENTS

| | | |
|---|---|---|
| JP | 2010-086236 A | 4/2010 |
| JP | 2012-094017 A | 5/2012 |
| JP | 2012-226687 A | 11/2012 |

(Continued)

*Primary Examiner* — Nan-Ying Yang
(74) *Attorney, Agent, or Firm* — K&L Gates LLP

(57) ABSTRACT

A display device includes: a first substrate; a second substrate opposed to the first substrate; a display functional layer arranged between the first substrate and the second substrate to display an image in a display region; a first electrode layer that is arranged in the display region and includes a plurality of first electrodes for detecting contact or proximity of an external object; a second electrode arranged between the first substrate and the second substrate to be opposed to the first electrodes; a plurality of third electrodes that are arranged between the first substrate and the second substrate and receive a pixel signal; and an insulating layer covering the first electrode layer. In the insulating layer, a relative dielectric constant of a portion superimposed on the first electrodes is different from a relative dielectric constant of a portion not superimposed on the first electrodes at least in the display region.

11 Claims, 34 Drawing Sheets

(56) References Cited

U.S. PATENT DOCUMENTS

2013/0175148 A1* 7/2013 Hisatsugu .............. H01H 59/00
200/181

FOREIGN PATENT DOCUMENTS

| JP | 2013-088932 A | 5/2013 |
| JP | 2014-203151 A | 10/2014 |
| JP | 2014-205244 A | 10/2014 |

* cited by examiner

DISPLAY DEVICE AND DETECTION DEVICE

CROSS-REFERENCE TO RELATED APPLICATIONS

This application claims priority from Japanese Application No. 2016-116341, filed on Jun. 10, 2016, the contents of which are incorporated by reference herein in its entirety.

BACKGROUND

1. Technical Field

The present disclosure relates to a display device and a detection device.

2. Description of the Related Art

In recent years, detection devices that can detect an external proximity object, what is called a touch panel, have been attracting attention. The touch panel is mounted on or integrated with a display device such as a liquid crystal display device to be used as a display device. As such a detection device, Japanese Patent Application Laid-open Publication No. 2014-205244 (JP-A-2014-205244) discloses an electrostatic capacitance type touch panel in which a first resin layer and a second resin layer are laminated on a conductive layer. In the electrostatic capacitance type touch panel disclosed in JP-A-2014-205244, high touch detection performance and high response speed are both achieved by arranging the first resin layer and the second resin layer having different relative dielectric constants.

It is known that a conductive layer for detecting an input position is arranged in a belt-shaped pattern, a rectangular pattern, or the like in the electrostatic capacitance type touch panel. In Patent Literature 1, the first resin layer and the second resin layer are uniformly arranged, so that a dielectric constant cannot be caused to be different only in a required region due to the pattern of the conductive layer. Thus, the detection performance can hardly be improved.

SUMMARY

According to one aspect, a display device includes a first substrate, a second substrate opposed to the first substrate, a display functional layer arranged between the first substrate and the second substrate to display an image in a display region, a first electrode layer that is arranged in the display region and includes a plurality of first electrodes for detecting contact or proximity of an external object, a second electrode arranged between the first substrate and the second substrate to be opposed to the first electrodes, a plurality of third electrodes that are arranged between the first substrate and the second substrate and receive a pixel signal, and an insulating layer covering the first electrode layer. In the insulating layer, a relative dielectric constant of a portion superimposed on the first electrodes is different from a relative dielectric constant of a portion not superimposed on the first electrodes at least in the display region.

According to one aspect, a detection device includes a substrate including a transmission region that transmits a displayed image, a first electrode layer that is arranged in the transmission region and includes a plurality of first electrodes for detecting contact or proximity of an external object, and an insulating layer covering the first electrode layer. In the insulating layer, a relative dielectric constant of a portion superimposed on the first electrodes is different from a relative dielectric constant of a portion not superimposed on the first electrodes at least in the transmission region.

DETAILED DESCRIPTION

Figure 1:
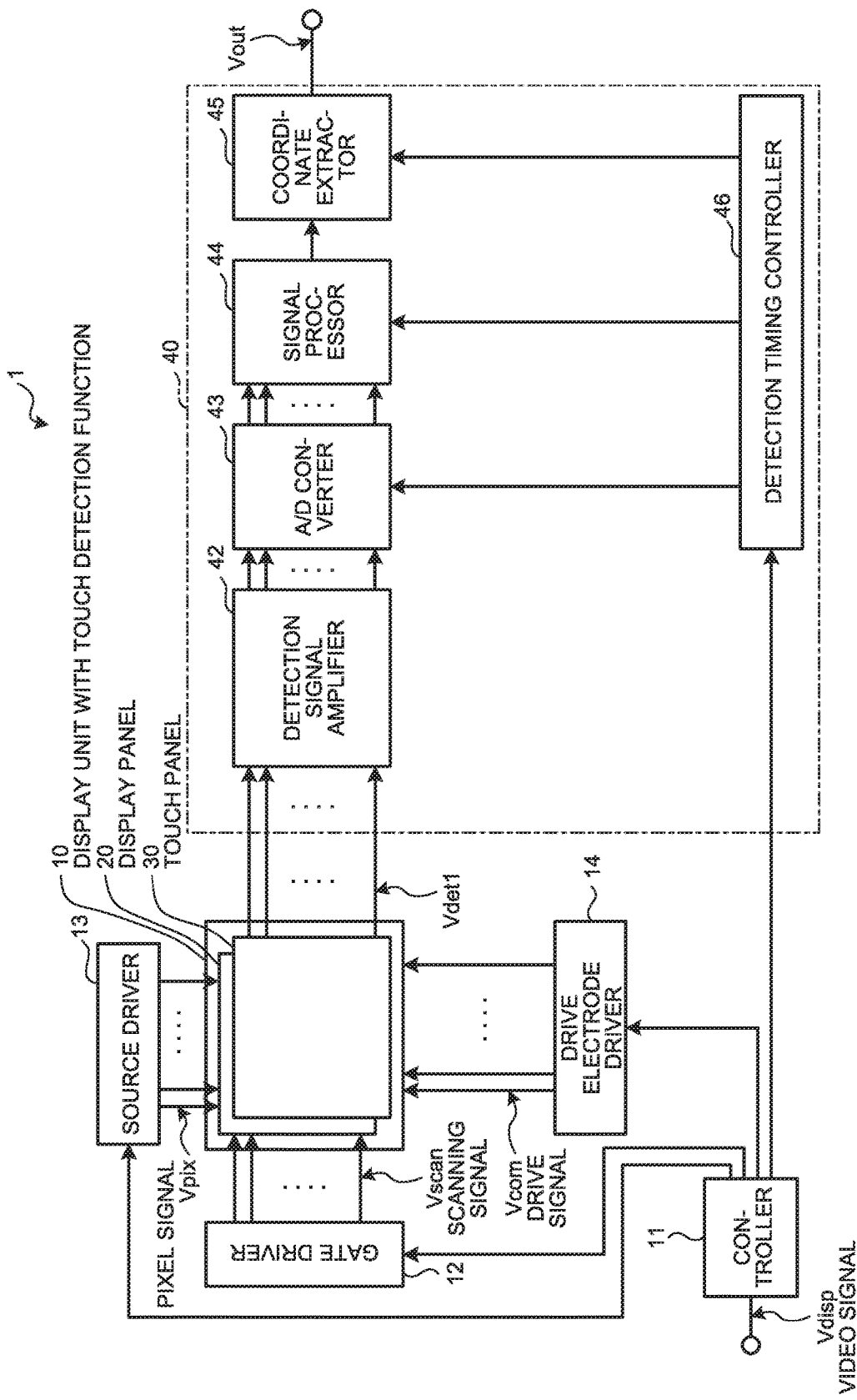
FIG. 1 is a block diagram illustrating a configuration example of a display device according to a first embodiment.

The following describes a mode for carrying out the invention (embodiments) in detail with reference to the drawings. The present invention is not limited to the embodiments described below. Components described below include a component that is easily conceivable by those skilled in the art and components that are substantially the same. The components described below can be appropriately combined. The disclosure is merely an example, and the present invention naturally encompasses an appropriate modification maintaining the gist of the invention that is easily conceivable by those skilled in the art. To further clarify the description, the width, the thickness, the shape, and the like of each component may be schematically illustrated in the drawings as compared with an actual aspect. However, the drawings merely provide examples, and are not intended to limit interpretation of the invention. The same element as that described in the drawing already discussed is denoted by the same reference numeral throughout the description and the drawings, and detailed description thereof will not be repeated in some cases.

First Embodiment

FIG. 1 is a block diagram illustrating a configuration example of a display device according to a first embodiment. As illustrated in FIG. 1, a display device 1 includes a display unit 10 with a touch detection function, a controller 11, a gate driver 12, a source driver 13, a drive electrode driver 14, and a detector 40. The display device 1 is a display device with a touch detection function in which the display unit 10 with a touch detection function (hereinafter, referred to as a display unit) incorporates a touch detection function therein. The display unit 10 is a device integrating a display panel 20 using a liquid crystal display element as a display element with a touch panel 30 serving as a detection device for detecting a touch input. The device integrating the display panel 20 with the touch panel 30 means a configuration in which some substrates and/or electrodes are shared by the display panel 20 and the touch panel 30, for example. The display unit 10 may be what is called an on-cell device in which the touch panel 30 is mounted on the display panel 20. The display panel 20 may be, for example, an organic EL display panel.

The display panel 20 is an element that performs display by sequentially performing scanning for each horizontal line in accordance with a scanning signal Vscan supplied from the gate driver 12.

The controller 11 is a circuit that supplies a control signal to the gate driver 12, the source driver 13, the drive electrode driver 14, and the detector 40 based on a video signal Vdisp supplied from the outside, and controls these components to operate in synchronization with each other.

The gate driver 12 has a function of sequentially selecting one horizontal line as a display driving target of the display unit 10 based on the control signal supplied from the controller 11.

The source driver 13 is a circuit that supplies a pixel signal Vpix to each sub-pixel SPix of the display unit 10 based on the control signal supplied from the controller 11. The controller 11 may generate the pixel signal Vpix, and may supply the pixel signal Vpix to the source driver 13.

The drive electrode driver 14 is a circuit that supplies a drive signal Vcom to a drive electrode COML of the display unit 10 based on the control signal supplied from the controller 11.

The touch panel 30 operates based on a basic principle of electrostatic capacitance type touch detection, performs a touch detection operation using a mutual capacitance system, and detects contact or proximity of an external object with respect to a display region. The touch panel 30 may perform a touch detection operation using a detection principle of a self capacitance system.

The detector 40 is a circuit that detects whether there is a touch based on the control signal supplied from the controller 11 and a first detection signal Vdet1 supplied from the touch panel 30. The detector 40 also determines coordinates and the like at which a touch input is performed. The detector 40 includes an amplifier 42, an A/D converter 43, a signal processor 44, and a coordinate extractor 45. The detection timing controller 46 controls the A/D converter 43, the signal processor 44, and the coordinate extractor 45 to operate in synchronization with each other based on the control signal supplied from the controller 11.

Figure 2:
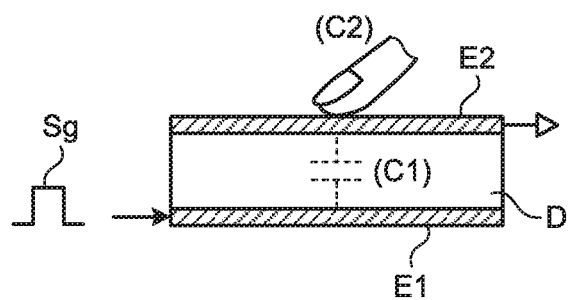
FIG. 2 is an explanatory diagram for explaining a basic principle of mutual capacitance touch detection.
Figure 3:
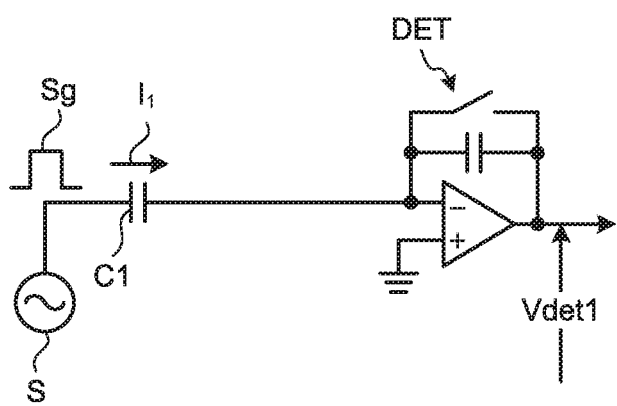
FIG. 3 is an explanatory diagram illustrating an example of an equivalent circuit for explaining the basic principle of mutual capacitance touch detection.
Figure 4:
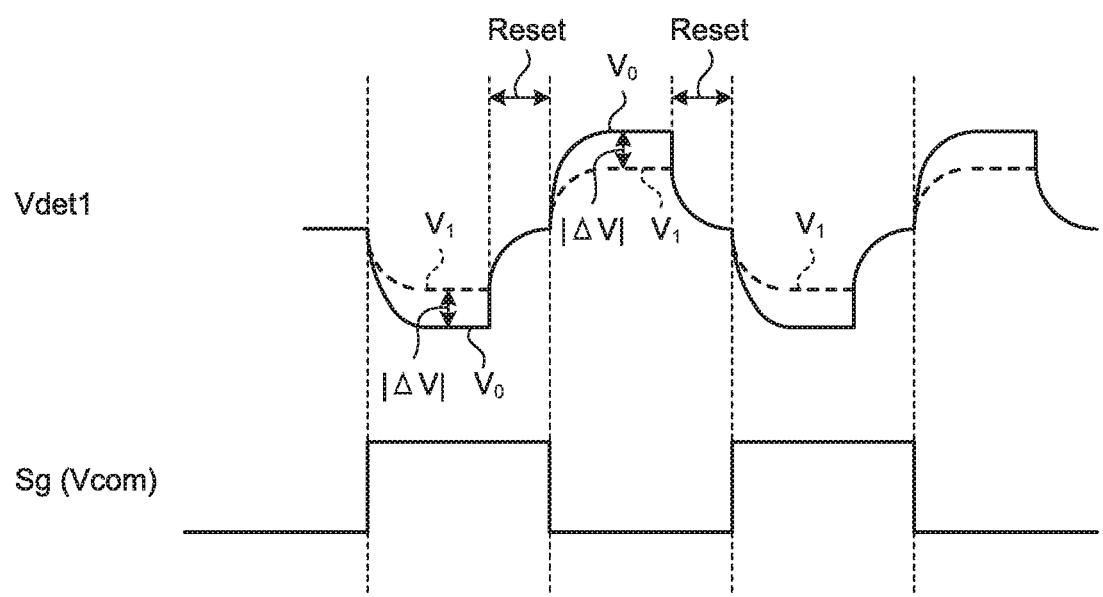
FIG. 4 is a diagram illustrating an example of waveforms of a drive signal and a detection signal of mutual capacitance touch detection.

As described above, the touch panel 30 operates based on the basic principle of electrostatic capacitance type touch detection. The following describes a basic principle of mutual capacitance touch detection of the display device 1 according to the present embodiment with reference to FIGS. 2 to 4. FIG. 2 is an explanatory diagram for explaining the basic principle of mutual capacitance touch detection. FIG. 3 is an explanatory diagram illustrating an example of an equivalent circuit for explaining the basic principle of mutual capacitance touch detection. FIG. 4 is a diagram illustrating an example of waveforms of a drive signal and a detection signal of mutual capacitance touch detection. The following describes a case in which a finger is brought into contact with or proximate to the touch panel as an example of the external object. However, the external object is not limited to a finger, and may be a stylus pen, for example.

For example, as illustrated in FIG. 2, a capacitive element C1 includes a pair of electrodes, that is, a drive electrode E1 and a detection electrode E2 arranged to be opposed to each other with a dielectric D interposed therebetween. In the capacitive element C1, an electric line of force corresponding to a fringe extending from an end of the drive electrode E1 toward an upper surface of the detection electrode E2 is generated in addition to an electric line of force (not illustrated) generated between opposing surfaces of the drive electrode E1 and the detection electrode E2. As illustrated in FIG. 3, one end of the capacitive element C1 is coupled to an AC signal source (driving signal source) S, and the other end thereof is coupled to a voltage detector DET. The voltage detector DET is an integrating circuit included in the amplifier 42 illustrated in FIG. 1, for example.

When an AC rectangular wave Sg having a predetermined frequency (for example, about several kilohertz to several hundreds of kilohertz) is applied to the drive electrode E1 (one end of the capacitive element C1) from the AC signal source S, an output waveform (first detection signal Vdet1) as illustrated in FIG. 4 appears via the voltage detector DET coupled to the detection electrode E2 (the other end of the capacitive element C1) side. The AC rectangular wave Sg corresponds to the drive signal Vcom input from the drive electrode driver 14.

In a state in which the finger is not in contact with or proximate to the touch panel (non-contact state), a current corresponding to a capacitance value of the capacitive element C1 flows in accordance with charge and discharge with respect to the capacitive element C1. The voltage detector DET illustrated in FIG. 3 converts a variation in the current corresponding to the AC rectangular wave Sg into a variation in voltage (a waveform $V_0$ of a solid line (refer to FIG. 4)).

On the other hand, in a state in which the finger is in contact with or proximate to the touch panel (contact state), as illustrated in FIG. 2, capacitance C2 generated by the finger is in contact with or proximate to the detection electrode E2. Due to this, the electric line of force corresponding to the fringe between the drive electrode E1 and the detection electrode E2 is blocked by a conductor (finger). Thus, the capacitive element C1 acts as a capacitive element having a capacitance value smaller than the capacitance value in the non-contact state. As illustrated in FIG. 3, a current $I_1$ flows in accordance with a change in the capacitance value of the capacitive element C1. As illustrated in FIG. 4, the voltage detector DET converts a variation in the current $I_1$ corresponding to the AC rectangular wave Sg into a variation in voltage (a waveform $V_1$ of a dotted line). In this case, amplitude of the waveform $V_1$ is smaller than that of the waveform $V_0$ described above. Accordingly, an absolute value $|\Delta V|$ of a voltage difference between the waveform $V_0$ and the waveform $V_1$ varies depending on influence of the conductor such as a finger that is brought into contact with or proximate to the touch panel from the outside. To detect the absolute value $|\Delta V|$ of the voltage difference between the waveform $V_0$ and the waveform $V_1$ accurately, it is more preferable to provide, in the operation of the voltage detector DET, a period Reset in which charge and discharge of the capacitor are reset in accordance with a frequency of the AC rectangular wave Sg through switching in the circuit.

The touch panel 30 illustrated in FIG. 1 performs mutual capacitance touch detection by sequentially performing scanning for each detection block in accordance with the drive signal Vcom supplied from the drive electrode driver 14.

The touch panel 30 outputs the first detection signal Vdet1 for each detection block via the voltage detector DET illustrated in FIG. 3 from each of a plurality of detection electrodes TDL. The first detection signal Vdet1 is supplied to the amplifier 42 of the detector 40. The amplifier 42 amplifies the first detection signal Vdet1. The A/D converter 43 samples each analog signal output from the amplifier 42 and converts each of the signals into a digital signal at a timing synchronized with the drive signal Vcom.

The signal processor 44 is a logic circuit that detects whether there is a touch on the touch panel 30 based on an output signal from the A/D converter 43. The signal processor 44 performs processing of extracting the absolute value $|\Delta V|$ of a differential signal of the detection signal, that is, a difference between the waveform $V_0$ and the waveform $V_1$ described above. The signal processor 44 compares the absolute value $|\Delta V|$ with a predetermined threshold voltage. If the absolute value $|\Delta V|$ is smaller than the threshold voltage, the signal processor 44 determines that the external proximity object is in the non-contact state. On the other hand, if the absolute value $|\Delta V|$ is equal to or larger than the threshold voltage, the signal processor 44 determines that the finger is in contact with or proximate to the detection electrode E2, that is, the finger is in a touch state. In this way, the detector 40 can perform touch detection.

The coordinate extractor 45 is a logic circuit that obtains, when a touch is detected by the signal processor 44, touch panel coordinates at which the touch is detected. The coordinate extractor 45 outputs the touch panel coordinates as an output signal Vout. As described above, based on the basic principle of mutual capacitance touch detection, the display device 1 according to the present embodiment can detect the touch panels coordinates of a position where the finger is in contact with or proximate to.

Figure 5:
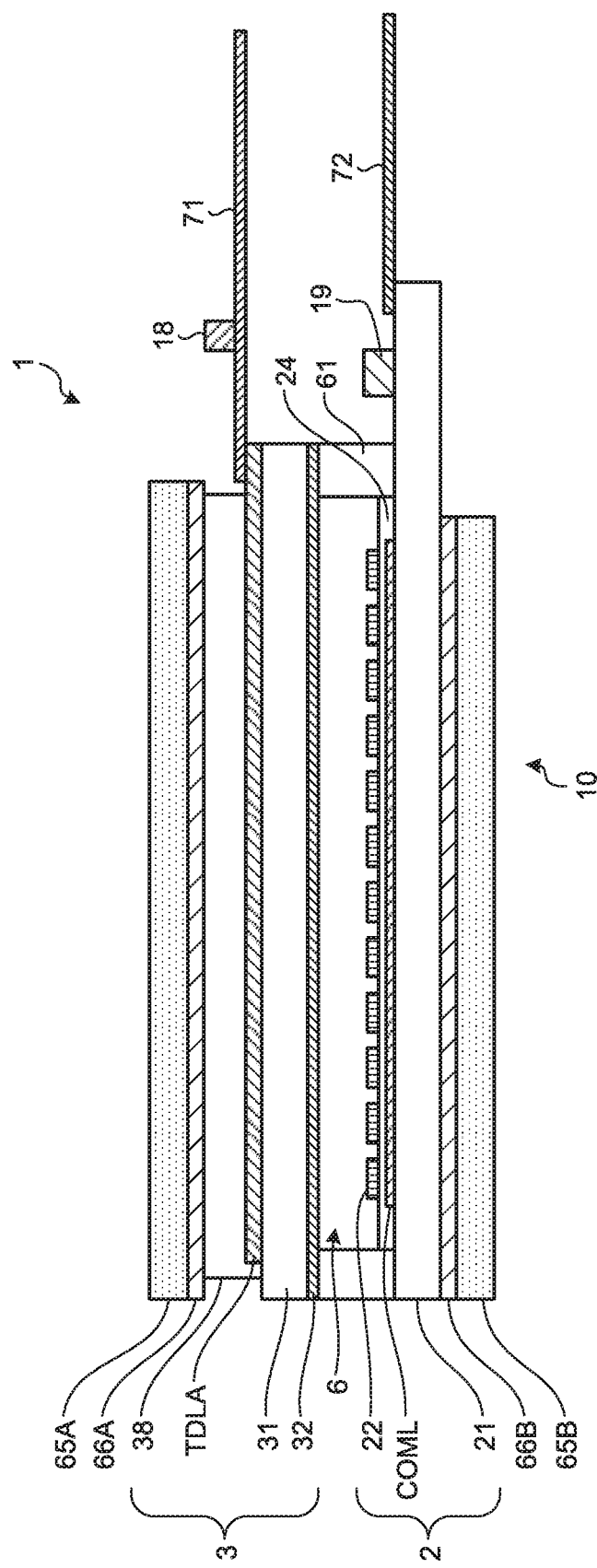
FIG. 5 is a cross-sectional view representing a schematic cross-sectional structure of the display device according to the first embodiment.
Figure 6:
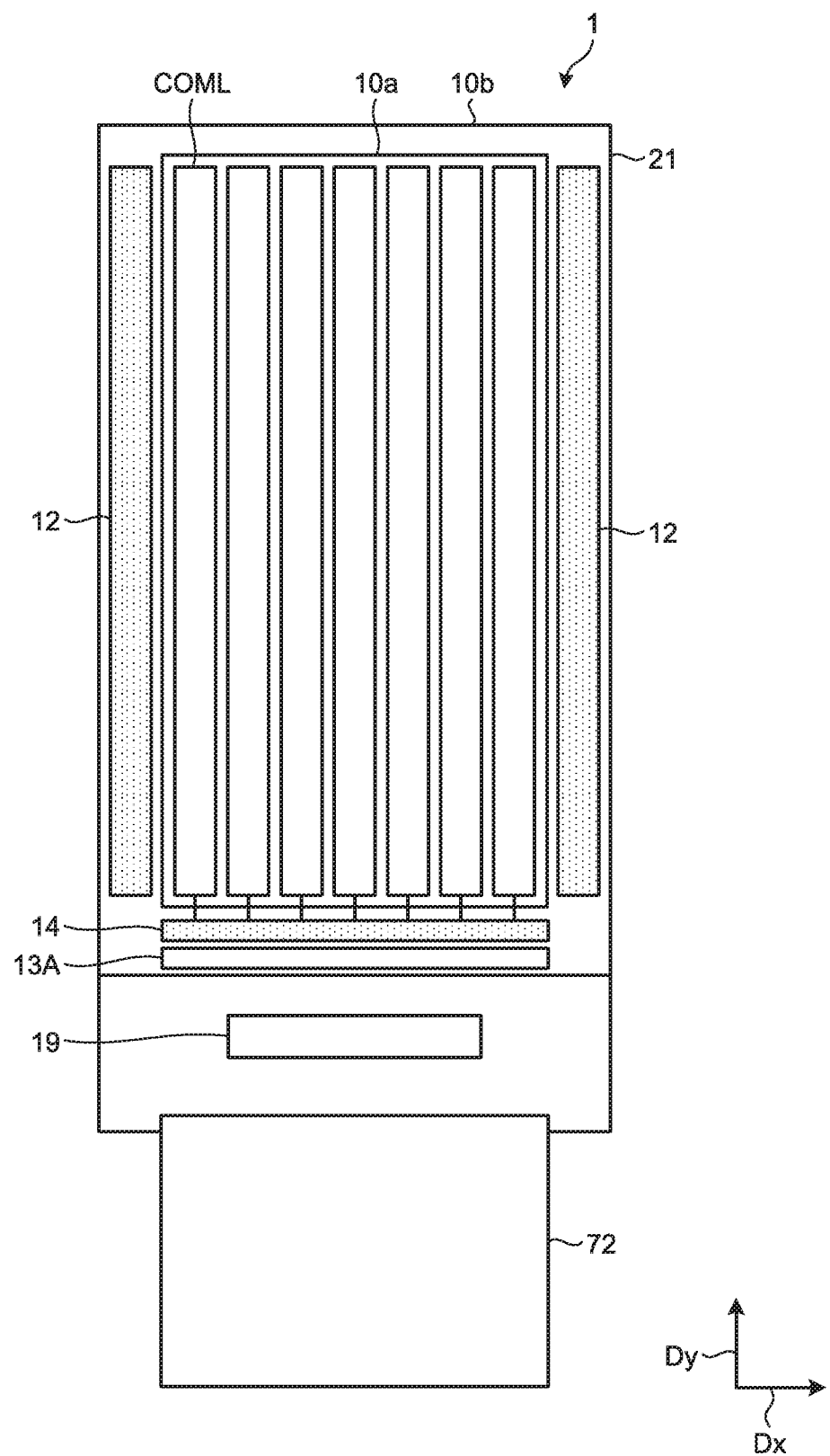
FIG. 6 is a plan view schematically illustrating a first substrate of the display device.
Figure 7:
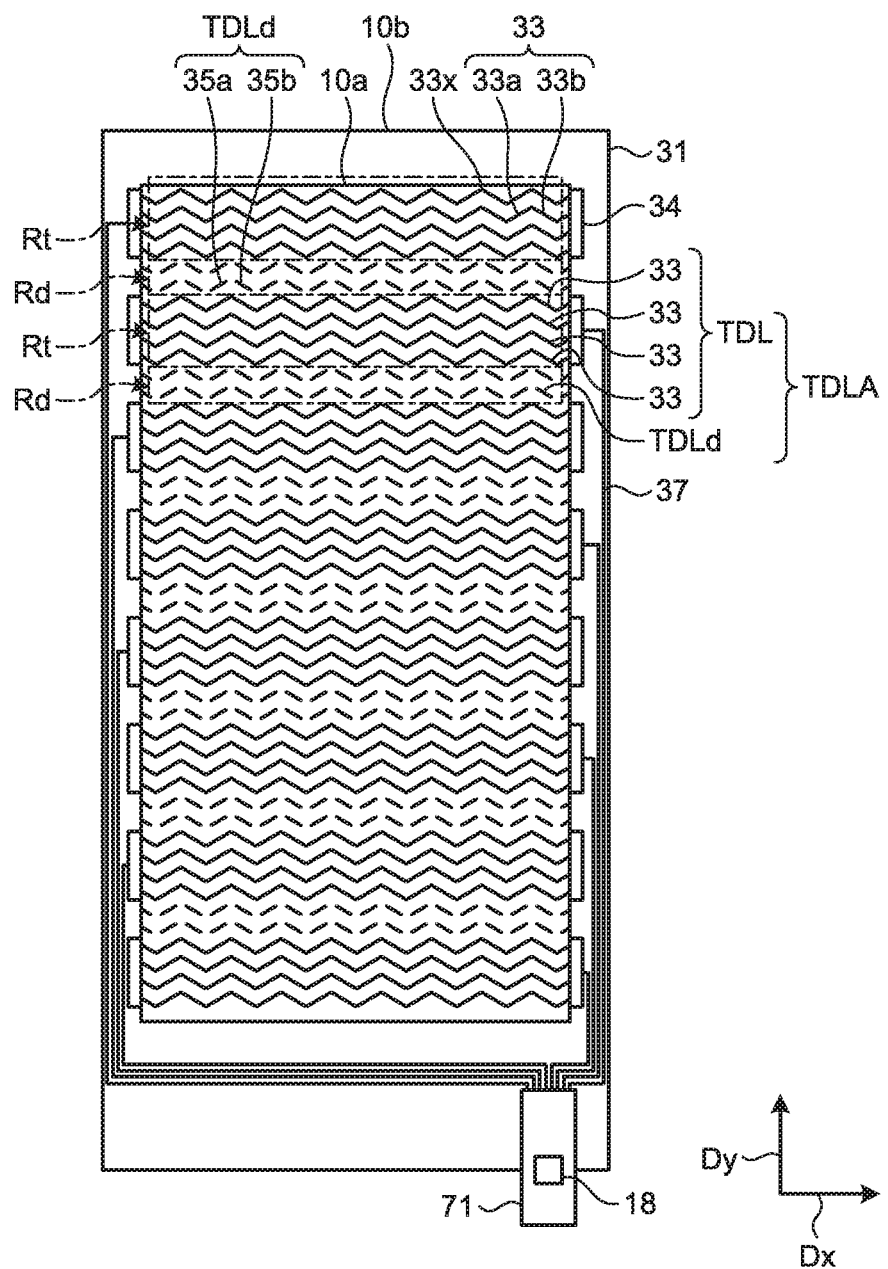
FIG. 7 is a plan view schematically illustrating a second substrate of the display device.

Next, the following describes a configuration example of the display device 1 according to the present embodiment in detail. FIG. 5 is a cross-sectional view representing a schematic cross-sectional structure of the display device according to the first embodiment. FIG. 6 is a plan view schematically illustrating a first substrate of the display device. FIG. 7 is a plan view schematically illustrating a second substrate of the display device.

As illustrated in FIG. 5, the display unit 10 includes a pixel substrate 2, a counter substrate 3 arranged to be opposed to a surface of the pixel substrate 2 in a perpendicular direction, and a liquid crystal layer 6 serving as a display functional layer interposed between the pixel substrate 2 and the counter substrate 3.

The pixel substrate 2 includes a first substrate 21 serving as a circuit board, a pixel electrode 22, and a drive electrode COML. The first substrate 21 is, for example, a glass substrate or a resin substrate. The drive electrode COML is arranged on the first substrate 21. A plurality of pixel electrodes 22 are arranged in a matrix in a plan view above the drive electrode COML via an insulating layer 24. In the first substrate 21, a thin film transistor (TFT) serving as a switching element (not illustrated in FIG. 5) is arranged corresponding to the pixel electrode 22. As illustrated in FIG. 5, a polarizing plate 65B may be arranged below the first substrate 21 with a bonding layer 66B interposed therebetween. The pixel electrode 22 and the drive electrode COML are made of, for example, a conductive material having translucency such as indium tin oxide (ITO).

The arrangement of the pixel electrodes 22 is not limited to a matrix arrangement along a first direction and a second direction orthogonal to the first direction. Adjacent pixel electrodes 22 may be arranged to be shifted from each other in the first direction or the second direction. Due to different sizes of the adjacent pixel electrodes 22, two or three pixel electrodes 22 may be arranged on one side of one pixel electrode 22 included in a pixel column arranged in the first direction.

A display control IC 19 (display driver IC) is arranged on the first substrate 21. The display control IC 19 is an IC chip mounted on the first substrate 21, for example, a chip on glass (COG). The display control IC 19 incorporates respective circuits required for a display operation, and functions as the controller 11 (refer to FIG. 1) described above. A flexible substrate 72 is coupled to an end of the first substrate 21. The display control IC 19 outputs a control signal to a gate line GCL, a data line SGL, and the like based on a video signal Vdisp (refer to FIG. 1) supplied from an external host IC (not illustrated).

The counter substrate 3 includes a second substrate 31, a color filter 32 arranged on one surface of the second substrate 31, a detection electrode layer TDLA arranged on the other surface of the second substrate 31, and an insulating layer 38 covering the detection electrode layer TDLA. The second substrate 31 is, for example, a glass substrate or a resin substrate. The detection electrode layer TDLA includes the detection electrode TDL (not illustrated in FIG. 5) that functions as the detection electrode of the touch panel 30. The insulating layer 38 includes a first insulating layer 38A and a second insulating layer 38B (not illustrated in FIG. 5) having different relative dielectric constants. A polarizing plate 65A is arranged above the detection electrode TDL via a bonding layer 66A. The color filter 32 may be arranged on the first substrate 21.

A flexible substrate 71 is coupled to the second substrate 31. Wiring on the flexible substrate 71 is coupled to the detection electrode TDL of the detection electrode layer TDLA via frame wiring. A detection control IC 18 (touch IC) mounted on the flexible substrate 71 functions as the detector 40 illustrated in FIG. 1. The first detection signal Vdet1 output from the detection electrode TDL is supplied to the detection control IC 18 via the flexible substrate 71. The detection control IC 18 may be included in the first substrate 21, or may be included in a control board outside a module. Part of the functions of the detector 40 may be included in the display control IC 19, or may be provided as a function of an external micro-processing unit (MPU).

The first substrate 21 and the second substrate 31 are arranged to be opposed to each other with a predetermined interval therebetween, and a space between the first substrate 21 and the second substrate 31 is sealed by a sealer 61. The liquid crystal layer 6 is arranged in the space between the first substrate 21 and the second substrate 31. The liquid crystal layer 6 modulates light passing therethrough depending on a state of the electric field. For example, liquid crystals of a lateral electric-field mode such as in-plane switching (IPS) including fringe field switching (FFS) are used for the liquid crystal layer 6. An orientation film may be arranged between the liquid crystal layer 6 and the pixel substrate 2, and between the liquid crystal layer 6 and the counter substrate 3 illustrated in FIG. 5.

A backlight (not illustrated) is arranged below the first substrate 21. The backlight includes, for example, a light source such as an LED, and emits light from the light source toward the first substrate 21. The light from the backlight passes through the pixel substrate 2, and a portion where the light is blocked not to be emitted and a portion where the light is emitted are switched with each other depending on the state of the liquid crystals at the position to display an image on a display surface.

As illustrated in FIG. 6, the display device 1 includes a display region 10a for displaying an image and a frame region 10b outside the display region 10a. The display region 10a has a rectangular shape having two opposed long sides and two opposed short sides. The frame region 10b has a frame shape surrounding four sides of the display region 10a. A direction along the short side of the display region 10a is assumed to be a first direction Dx herein. A direction intersecting with the first direction Dx and along the long side of the display region 10a is assumed to be a second direction Dy.

A plurality of drive electrodes COML are arranged in the display region 10a of the first substrate 21. Each of the drive electrodes COML is arranged along the second direction Dy, and the drive electrodes COML are arranged in the first direction Dx. The drive electrode driver 14, a multiplexer 13A, and the display control IC 19 are arranged along the short side of the frame region 10b of the first substrate 21, and the gate driver 12 is arranged along the long side of the frame region 10b. The multiplexer 13A is a circuit for switching a coupling state between the data line SGL and the display control IC 19. The flexible substrate 72 is coupled to the short side of the frame region 10b. The drive electrode driver 14 and the flexible substrate 72 are arranged in the vicinity of an end of the drive electrode COML. Thus, an area of the frame region 10b can be reduced by shortening a length of wiring coupled to the drive electrode COML. In FIG. 6, the gate driver 12 is arranged along each of opposed long sides of the frame region 10b. Alternatively, one gate driver 12 may be arranged on one of the long sides. Part or all of the functions of the drive electrode driver 14 may be included in the display control IC 19.

As illustrated in FIG. 7, the detection electrode layer TDLA is arranged in the display region 10a of the second substrate 31. The detection electrode layer TDLA includes the detection electrode TDL that functions as the detection electrode of the touch panel 30 and a dummy electrode TDLd that does not function as the detection electrode. A detection electrode region Rt in which the detection electrode TDL is arranged and a dummy electrode region Rd in which the dummy electrode TDLd is arranged are alternately arranged in the second direction Dy.

The detection electrode TDL includes a plurality of pieces of metal wiring 33. The metal wiring 33 includes a thin wire piece 33a and a thin wire piece 33b alternately coupled to each other at a coupling part 33x. The thin wire piece 33a and the thin wire piece 33b are inclined in opposite directions with respect to the first direction Dx, the metal wiring 33 is formed to be a zigzag line or a wavy line, and the metal wiring 33 is arranged along the first direction Dx as a whole. The pieces of metal wiring 33 are arranged at intervals in the second direction Dy. Ends of the pieces of metal wiring 33 are coupled to each other via a pad part 34, and the pieces of metal wiring 33 function as one detection electrode TDL. In the example illustrated in FIG. 7, one detection electrode TDL includes four pieces of metal wiring 33. However, the embodiment is not limited thereto. The detection electrode TDL may include three or less pieces of metal wiring 33 or five or more pieces of metal wiring 33. The metal wiring 33 is not necessarily configured to be a triangular wave form, and may be configured to be a curved form such as a sinusoidal wave.

The detection electrode TDL is arranged in a belt shape along the first direction Dx as a whole, and a plurality of detection electrodes TDL are arranged in the second direction Dy. Frame wiring 37 is coupled to the pad part 34 of each detection electrode TDL. The frame wiring 37 is arranged along the long side of the frame region 10b, and coupled to the flexible substrate 71 arranged on the short side of the frame region 10b of the second substrate 31.

The dummy electrode TDLd includes a thin wire piece 35a and a thin wire piece 35b. The thin wire piece 35a is arranged in parallel with the thin wire piece 33a of the metal wiring 33, and the thin wire piece 35b is arranged in parallel with the thin wire piece 33b of the metal wiring 33. The thin wire piece 35a and the thin wire piece 35b are alternately arranged in the first direction Dx at intervals, and a plurality of thin wire pieces 35a and thin wire pieces 35b are arranged in the second direction Dy.

The dummy electrode TDLd is arranged between the detection electrodes TDL arranged in the second direction Dy. The dummy electrode TDLd is arranged with an interval from the detection electrode TDL, and caused to be in a floating state in which a voltage signal is not supplied and electric potential is not fixed in touch detection.

The detection electrode region Rt includes a portion overlapped with a plurality of pieces of metal wiring 33 constituting the detection electrode TDL and a portion between adjacent pieces of metal wiring 33, and has a rectangular shape as a whole. The dummy electrode region Rd includes at least a portion overlapped with the thin wire piece 35a and the thin wire piece 35b, and is a region between adjacent detection electrode regions Rt and Rt.

The metal wiring 33 constituting the detection electrode TDL is made of at least one of metallic materials including aluminum (Al), copper (Cu), silver (Ag), molybdenum (Mo), and an alloy thereof. The metal wiring 33 may be a laminate obtained by using one or more of these metallic materials and laminating a plurality of metallic materials. At least one of the metallic materials including aluminum (Al), copper (Cu), silver (Ag), molybdenum (Mo), and an alloy thereof has lower resistance than that of a translucent conductive oxide such as ITO. These metallic materials have a light shielding property as compared with the translucent conductive oxide such as ITO, so that transmittance may be lowered or a pattern of the detection electrode TDL may be visually recognized. In the present embodiment, one detection electrode TDL includes a plurality of thin pieces of metal wiring 33, and the pieces of metal wiring 33 are formed to be a zigzag line or a wavy line and arranged at intervals larger than a wire width, so that lower resistance and invisibility can be achieved. As a result, resistance of the detection electrode TDL is lowered, the thickness of the display device 1 can be reduced, a screen size thereof can be increased, or higher definition can be achieved.

The width of the metal wiring 33 is preferably in a range from 2 µm to 10 µm. This is because, if the width of the metal wiring 33 is equal to or smaller than 10 µm, an area of the display region 10a overlapped with an opening as a region surrounded by a black matrix is reduced, and a possibility that the aperture ratio is impaired is lowered. Additionally, if the width of the metal wiring 33 is equal to or larger than 2 µm, the shape is stabilized, and a possibility of disconnection is lowered.

The thin wire piece 35a and the thin wire piece 35b constituting the dummy electrode TDLd are preferably made of the same metallic material as the metal wiring 33. Accordingly, a difference in light transmittance between the detection electrode region Rt and the dummy electrode region Rd can be suppressed, and the detection electrode TDL and/or the thin wire piece 35a constituting the dummy electrode TDLd can be made invisible. To suppress reflectivity, blackening treatment is preferably performed on an outermost surface of the metal wiring 33, the thin wire piece 35a, and the thin wire piece 35b.

In the present embodiment, the detection electrode TDL includes a plurality of pieces of metal wiring 33. However, the embodiment is not limited thereto. The detection electrode TDL may be a belt-shaped electrode along the first direction Dx intersecting with the drive electrode COML, and be made of a translucent conductive oxide such as ITO similarly to the drive electrode COML.

Figure 8:
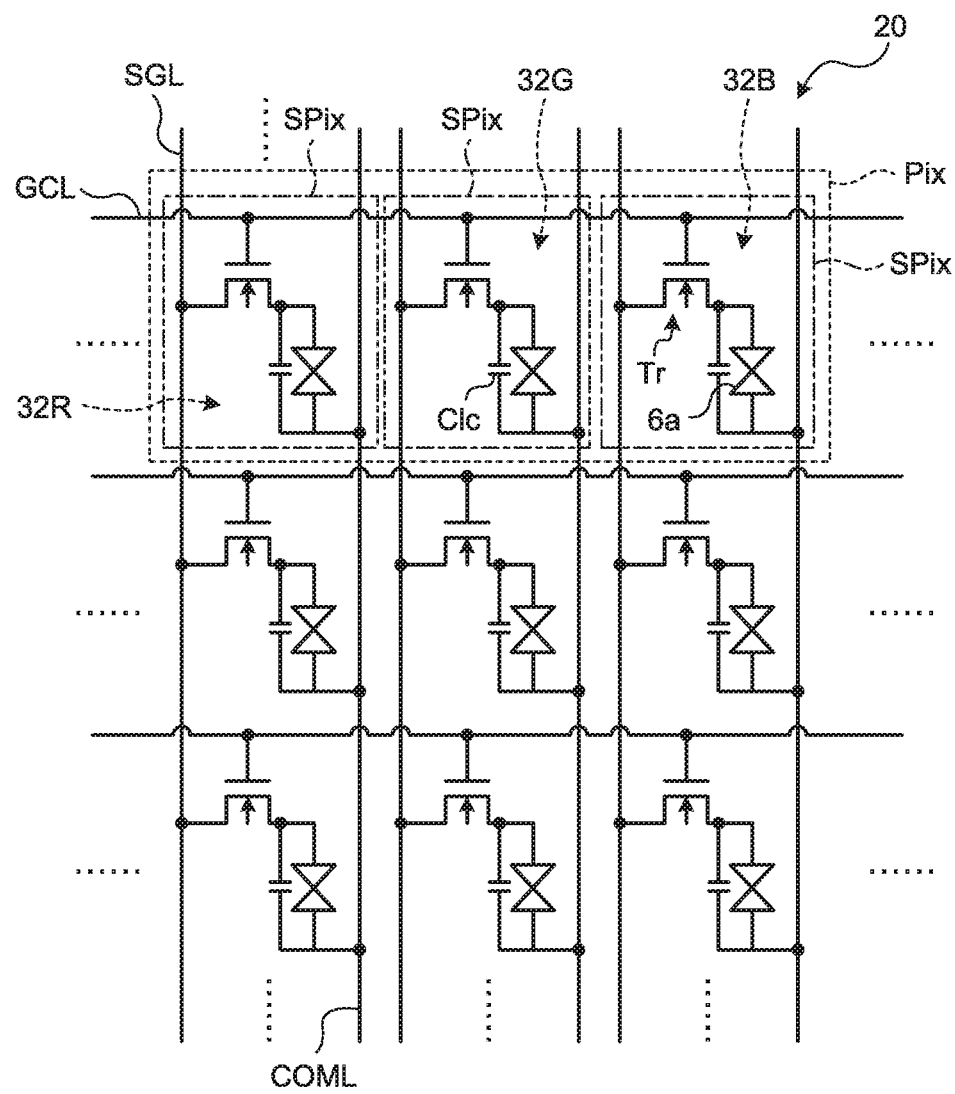
FIG. 8 is a circuit diagram representing a pixel array of a display unit according to the first embodiment.

Next, the following describes a display operation of the display panel 20. FIG. 8 is a circuit diagram representing a pixel array of the display unit according to the first embodiment. Pieces of wiring are formed on the first substrate 21 (refer to FIG. 5), the pieces of wiring including a switching element (hereinafter, referred to as a TFT element) Tr of each sub-pixel SPix illustrated in FIG. 8, the data line SGL for supplying the pixel signal Vpix to each pixel electrode 22, the gate line GCL for supplying the drive signal that drives each TFT element Tr, and the like. The data line SGL and the gate line GCL extend on a plane parallel with the surface of the first substrate 21.

The display panel 20 illustrated in FIG. 8 includes a plurality of sub-pixels SPix arranged in a matrix. Each sub-pixel SPix includes the TFT element Tr and a liquid crystal element 6a. The TFT element Tr includes a thin film transistor. In this example, the TFT element Tr includes an n-channel metal oxide semiconductor (MOS) type TFT. The insulating layer 24 is arranged between the pixel electrode 22 and a common electrode (drive electrode COML) to form holding capacitance Clc illustrated in FIG. 8.

The gate driver 12 illustrated in FIG. 1 drives the gate line GCL to sequentially perform scanning. The gate driver 12 applies the scanning signal Vscan (refer to FIG. 1) to a gate of the TFT element Tr of the sub-pixel SPix via the gate line GCL. Accordingly, one line of the sub-pixels SPix (one horizontal line) is sequentially selected as a display driving target. The source driver 13 supplies the pixel signal Vpix to the sub-pixel SPix constituting the selected one horizontal line via the data line SGL. In this way, in performing a display operation for each horizontal line, the drive electrode driver 14 applies the drive signal Vcom (display drive signal Vcomd) to the drive electrode COML. Accordingly, each drive electrode COML functions as a common electrode for the pixel electrode 22 in performing display.

In the color filter 32 illustrated in FIG. 5, color regions of the color filter colored in three colors, for example, red (R), green (G), and blue (B) may be periodically arranged. A group of color regions 32R, 32G, and 32B of three colors R, G, and B is associated with each sub-pixel SPix illustrated in FIG. 8 described above, and a pixel Pix includes a group of sub-pixels SPix corresponding to the color regions 32R, 32G, and 32B of three colors.

As illustrated in FIG. 8, in the present embodiment, the drive electrode COML is arranged along the data line SGL being intersecting with the gate line GCL. Thus, wiring from the drive electrode COML can be drawn toward the short side (flexible substrate 72 side) of the frame region 10b (refer to FIG. 6). Accordingly, the drive electrode driver 14 is not necessarily arranged on the long side of the frame region 10b as compared with a case in which the drive electrode COML is arranged in a direction orthogonal to the data line SGL, and the width of the frame region 10b can be reduced. The arrangement of the drive electrode COML is not limited thereto, and the drive electrode COML may be arranged along the gate line GCL, for example.

Figure 9:
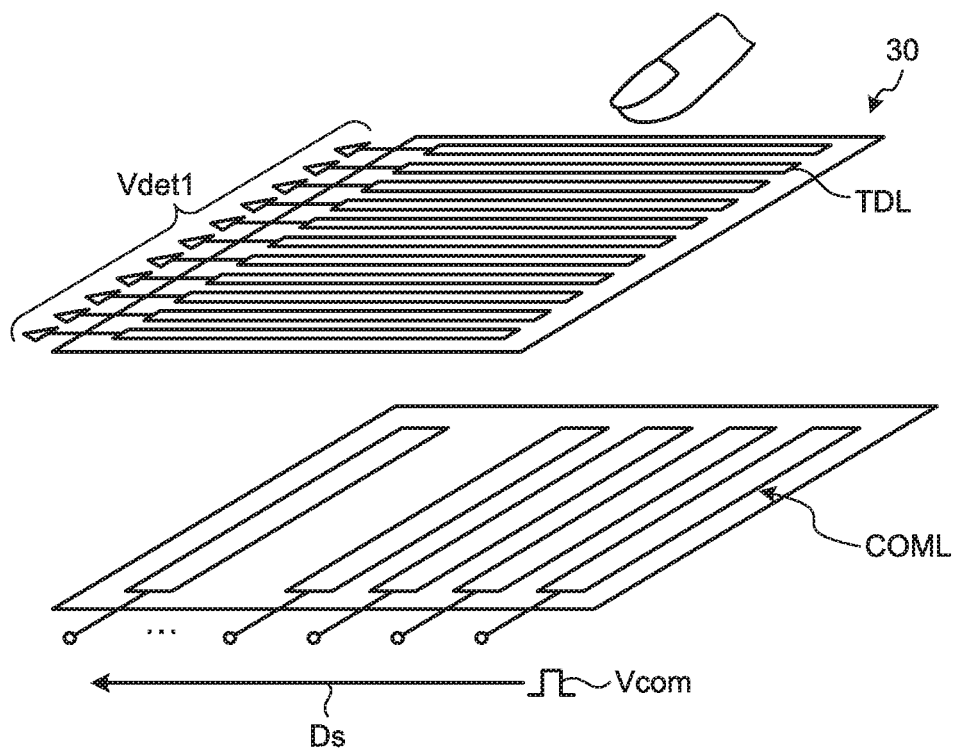
FIG. 9 is a perspective view representing a configuration example of a drive electrode and a detection electrode of the display unit according to the first embodiment.

The drive electrode COML illustrated in FIGS. 5 and 6 functions as a common electrode for a plurality of pixel electrodes 22 of the display panel 20. The drive electrode COML also functions as a drive electrode in performing mutual capacitance touch detection on the touch panel 30. The drive electrode COML may function as a detection electrode in performing self capacitance touch detection on the touch panel 30. FIG. 9 is a perspective view representing a configuration example of the drive electrode and the detection electrode of the display unit according to the first embodiment.

The touch panel 30 includes the drive electrode COML arranged in the pixel substrate 2 and the detection electrode TDL arranged in the counter substrate 3. The detection electrode TDL includes a plurality of stripe-shaped electrode patterns extending in the horizontal direction of FIG. 9. The drive electrode COML extends in a direction intersecting with the extending direction of the detection electrode TDL. Capacitance is generated at each intersecting portion of each electrode pattern of the drive electrode COML and each electrode pattern of the detection electrode TDL.

In the touch panel 30, in performing a mutual capacitance touch detection operation, a drive electrode block is sequentially scanned one by one by the drive electrode driver 14 in a time division manner. Accordingly, the drive electrode COML of the drive electrode block is sequentially selected along a scanning direction Ds. The first detection signal Vdet1 is then output from the detection electrode TDL. The drive electrode block corresponds to the drive electrode E1 in the basic principle of mutual capacitance touch detection described above, and the detection electrode TDL corresponds to the detection electrode E2.

In this case, when the thickness of the display device 1 is reduced, and the second substrate 31 (refer to FIG. 5) is thinned, for example, the capacitance between the drive electrode COML and the detection electrode TDL is increased, and parasitic capacitance between the drive electrode COML and various pieces of wiring is increased. Accordingly, responsiveness of touch detection may be lowered.

Even when the thickness of the display device 1 is reduced, detection performance is desired to be improved. Responsiveness of the drive signal Vcom is enhanced, the first detection signal Vdet1 is increased, and noise entered from the outside is reduced, so that a signal to noise ratio (SNR) is increased, and thus the detection performance can be improved.

Figure 10:
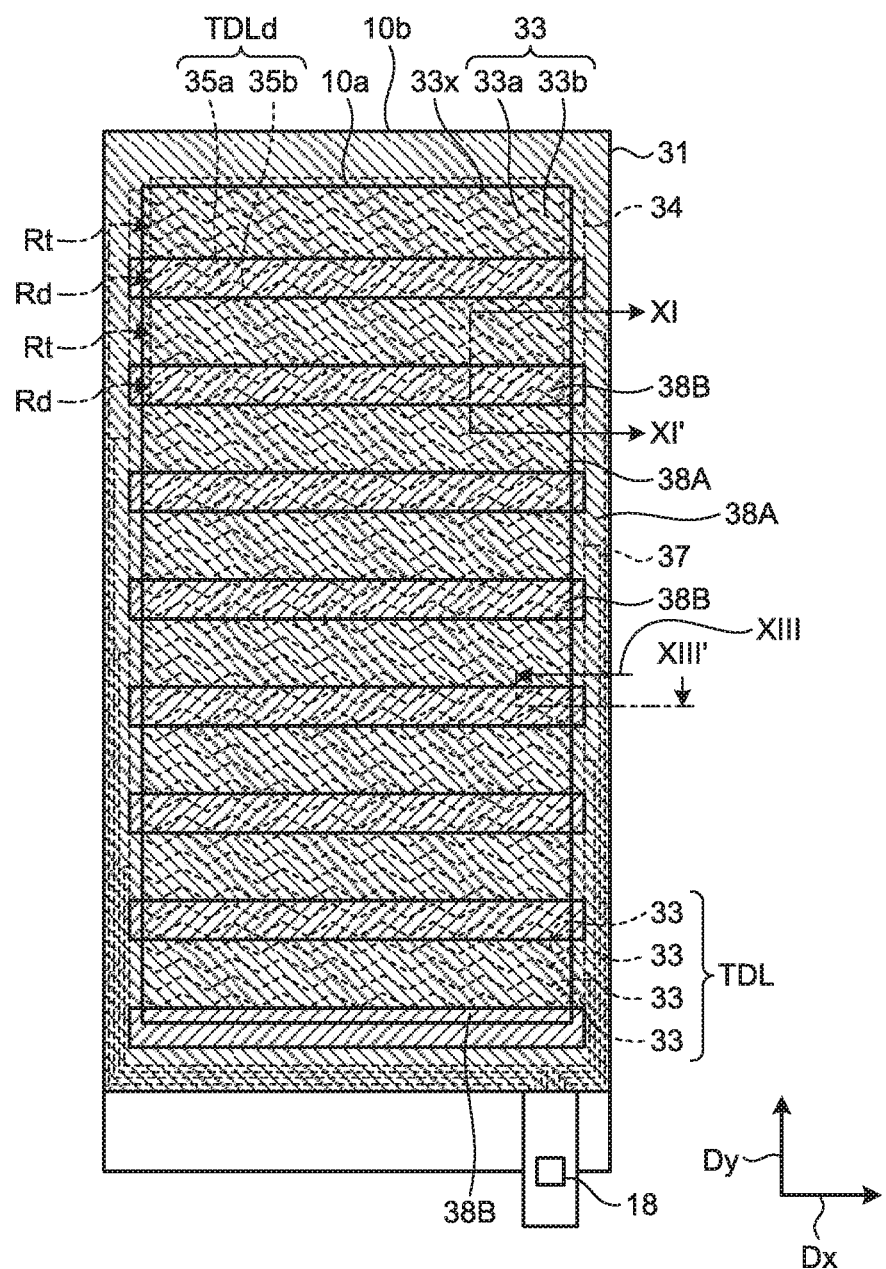
FIG. 10 is a plan view for explaining an arrangement relation between an insulating layer and a detection electrode layer.
Figure 11:
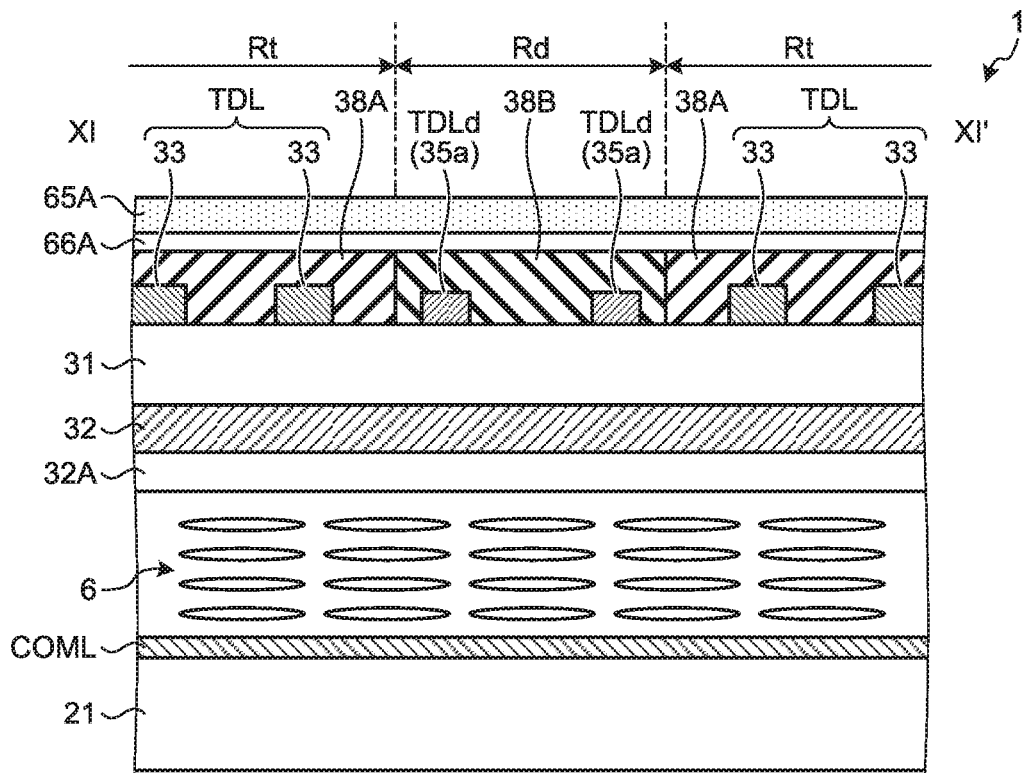
FIG. 11 is a cross-sectional view along the line XI-XI' in FIG. 10.
Figure 12:
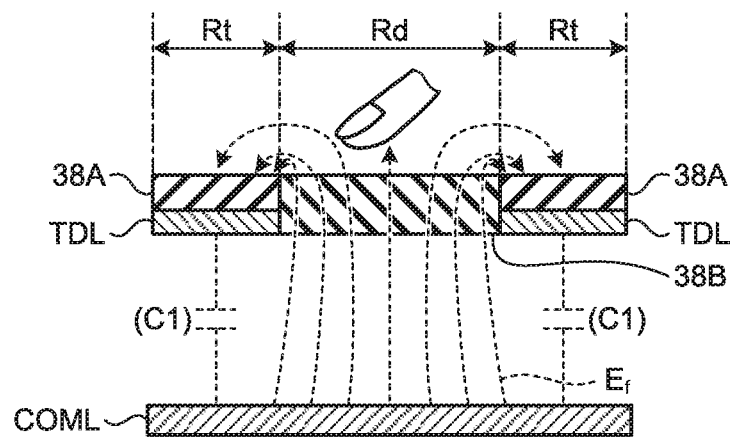
FIG. 12 is an explanatory diagram for schematically explaining an electric field passing through the insulating layer in touch detection.

Next, the following describes a configuration of the insulating layer 38 in the display device 1 according to the present embodiment. FIG. 10 is a plan view for explaining an arrangement relation between the insulating layer and the detection electrode layer. FIG. 11 is a cross-sectional view along the line XI-XI' in FIG. 10. FIG. 12 is an explanatory diagram for schematically explaining an electric field passing through the insulating layer in touch detection.

As illustrated in FIGS. 10 and 11, the insulating layer 38 includes the first insulating layer 38A and the second insulating layer 38B. The first insulating layer 38A has a first relative dielectric constant, and the second insulating layer 38B has a second relative dielectric constant larger than the first relative dielectric constant. For example, the first relative dielectric constant is smaller than 3.5, and the second relative dielectric constant is equal to or larger than 3.5. The first insulating layer 38A is made of, for example, polysiloxane, polysilazane, acrylic, polycarbonate, polyethylene terephthalate, and a fluorine-doped silicon dioxide. The second insulating layer 38B is made of a resin material including a silicon dioxide, a silicon nitride, an aluminium oxide, a zirconium oxide, or another metal oxide. The silicon dioxide, the silicon nitride, the aluminium oxide, the zirconium oxide, or another metal oxide is a material having a relative dielectric constant equal to or larger than 3.5. The second insulating layer 38B is formed by dispersing one or two or more of these materials in resin, and has a relative dielectric constant equal to or larger than 3.5 as a whole.

As illustrated in FIG. 10, the insulating layer 38 is arranged in the display region 10a and the frame region 10b, and covers the detection electrode TDL and the dummy electrode TDLd. In the insulating layer 38, the first insulating layer 38A is arranged at a position superimposed on the detection electrode TDL, and the second insulating layer 38B is arranged at a position not superimposed on the detection electrode TDL, that is, a position superimposed on the dummy electrode TDLd.

As illustrated in FIGS. 10 and 11, the first insulating layer 38A is arranged in the entire detection electrode region Rt. The first insulating layer 38A is arranged at a position superimposed on the metal wiring 33 constituting the detection electrode TDL, and arranged between the pieces of metal wiring 33. As illustrated in FIG. 11, the first insulating layer 38A is continuously arranged over the metal wiring 33 and the second substrate 31 exposed from the metal wiring 33 in the detection electrode region Rt.

The second insulating layer 38B is arranged in the entire dummy electrode region Rd. The second insulating layer 38B is arranged at a position superimposed on the thin wire pieces 35a and 35b. The second insulating layer 38B is also arranged between the thin wire piece 35a and the thin wire piece 35b, between the thin wire pieces 35a, and between the thin wire pieces 35b. As illustrated in FIG. 11, the second insulating layer 38B is continuously arranged over the thin wire pieces 35a and 35a and over the second substrate 31 exposed from the thin wire pieces 35a and 35a in the dummy electrode region Rd. Although FIG. 11 illustrates only the thin wire piece 35a of the dummy electrode TDLd, the second insulating layer 38B is also arranged over the thin wire piece 35b and the second substrate 31 exposed from the thin wire piece 35b. The first insulating layer 38A and the second insulating layer 38B are arranged between the dummy electrode TDLd and the detection electrode TDL adjacent to each other on the second substrate 31.

As illustrated in FIG. 11, the first insulating layer 38A has the same thickness as that of the second insulating layer 38B, and is arranged being in contact with a side surface of the second insulating layer 38B. The thickness of the first insulating layer 38A is a length from an upper surface of the second substrate 31 to an upper surface of the first insulating layer 38A in a direction perpendicular to the upper surface of the second substrate 31. The pixel electrode 22 is not illustrated in FIG. 11. A protective layer 32A may be arranged in the color filter 32.

With such a configuration, in at least the display region 10a, the relative dielectric constant of the insulating layer 38 in the dummy electrode region Rd not overlapped with the detection electrode TDL becomes larger than the relative dielectric constant in the detection electrode region Rt overlapped with the detection electrode TDL.

FIG. 12 is a diagram for schematically explaining a fringe electric field Ef generated between the drive electrode COML and the detection electrode TDL. To clarify the configuration, FIG. 12 illustrates the detection electrode TDL as one electrode, and does not illustrate the dummy electrode TDLd. As illustrated in FIG. 12, the second insulating layer 38B is arranged in the dummy electrode region Rd not overlapped with the detection electrode TDL, and the first insulating layer 38A is arranged in the detection electrode region Rt overlapped with the detection electrode TDL.

The fringe electric field Ef generated between the drive electrode COML and the detection electrode TDL passes through the second insulating layer 38B between the detection electrodes TDL to reach the external object. In the present embodiment, the relative dielectric constant of the second insulating layer 38B is larger than the relative dielectric constant of the first insulating layer 38A. Accordingly, an electric line of force of the fringe electric field Ef passing through the second insulating layer 38B reaches a farther position upward from the detection electrode TDL. A reachable range of the electric line of force is enlarged, so that detection sensitivity can be improved.

Figure 13:
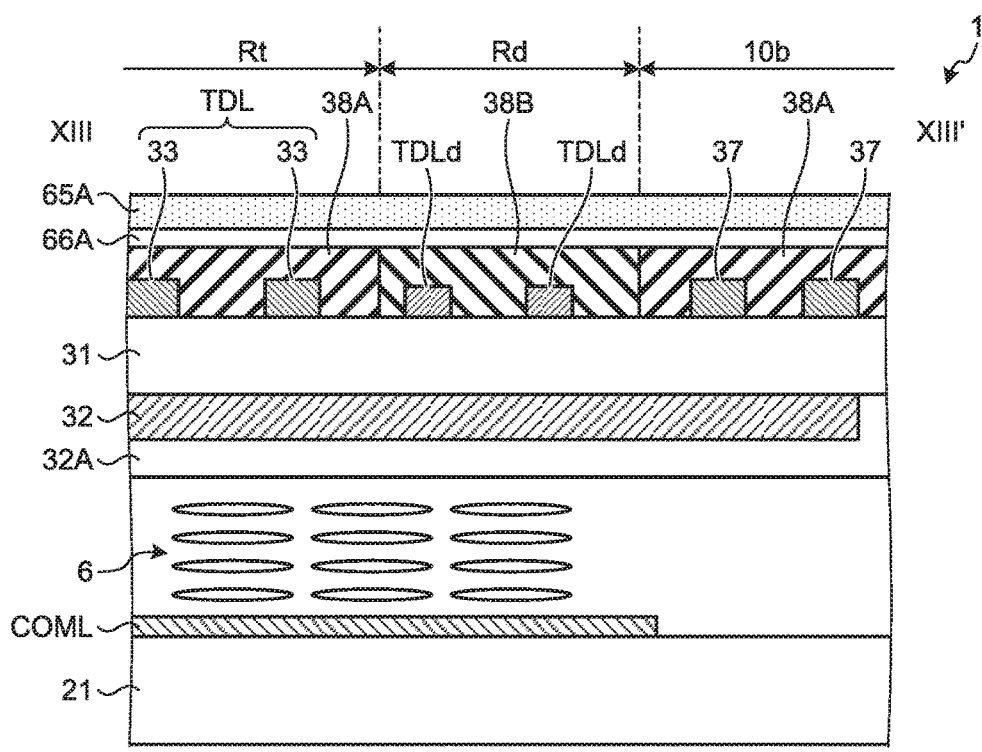
FIG. 13 is a cross-sectional view along the line XIII-XIII' in FIG. 10.

FIG. 13 is a cross-sectional view along the line XIII-XIII' in FIG. 10. As illustrated in FIG. 13, in the frame region 10b, the first insulating layer 38A is arranged at a position superimposed on the frame wiring 37. The first insulating layer 38A is also continuously arranged over the second substrate 31 exposed from the frame wiring 37.

In this way, by arranging the first insulating layer 38A having a relatively small relative dielectric constant at the position superimposed on the frame wiring 37, external noise hardly passes through the first insulating layer 38A. Accordingly, noise is prevented from entering the frame wiring 37. Thus, with the display device 1 according to the present embodiment, the detection performance can be improved by increasing the SNR.

As illustrated in FIGS. 11 and 13, the polarizing plate 65A is arranged above the first insulating layer 38A and the second insulating layer 38B via the bonding layer 66A. In the present embodiment, as the bonding layer 66A, a conductive bonding material including a conductive material can be used. The bonding layer 66A has a sheet resistance value larger than that of the metal wiring 33 constituting the detection electrode TDL. The bonding layer 66A can be arranged to cause static electricity accumulated on the polarizing plate 65A from the outside to flow to the detection electrode TDL via the bonding layer 66A. The static electricity from the outside can be released to the ground via the detection electrode TDL.

First Modification

Figure 14:
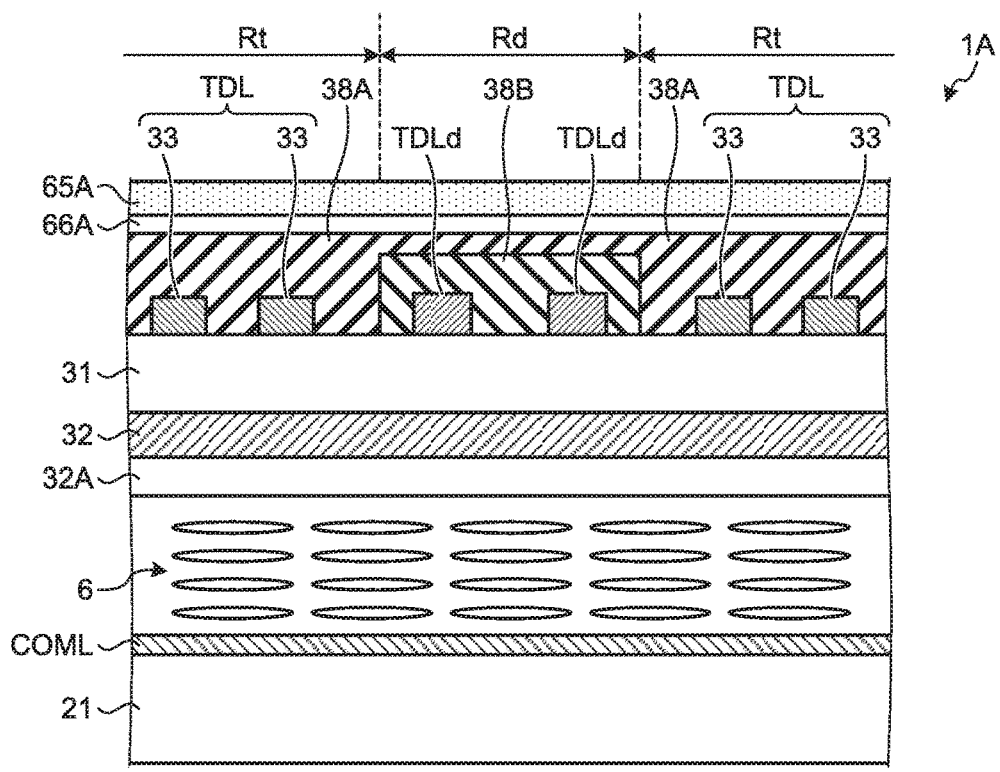
FIG. 14 is a cross-sectional view illustrating a laminated structure of an insulating layer of a display device according to a first modification of the first embodiment.

FIG. 14 is a cross-sectional view illustrating a laminated structure of the insulating layer of the display device according to a first modification of the first embodiment. In a display device 1A according to the present modification, one first insulating layer 38A is arranged while covering the detection electrode TDL in the detection electrode region Rt. In the dummy electrode region Rd, the second insulating layer 38B having a relatively high relative dielectric constant is arranged while covering the dummy electrode TDLd. Additionally, the first insulating layer 38A having a relative dielectric constant which is relatively low is arranged on the second insulating layer 38B. Herein, "the relative dielectric constant is relatively low" means that the relative dielectric constant of the first insulating layer 38A is at least lower than the relative dielectric constant of the second insulating layer 38B. Herein, "the relative dielectric constant is relatively high" means that the relative dielectric constant of the second insulating layer 38B is at least higher than the relative dielectric constant of the first insulating layer 38A. The first insulating layer 38A is continuously arranged over the detection electrode region Rt and the dummy electrode region Rd while covering the second insulating layer 38B. In this case, as illustrated in FIG. 14, the thickness of the first insulating layer 38A in the dummy electrode region Rd is smaller than the thickness of the first insulating layer 38A in the detection electrode region Rt.

Also in such an aspect, the relative dielectric constant in the dummy electrode region Rd is larger than the relative dielectric constant in the detection electrode region Rt, so that the fringe electric field Ef illustrated in FIG. 12 passes through the dummy electrode region Rd to reach a farther position upward from the detection electrode TDL. The reachable range of the electric line of force is enlarged, so that good detection sensitivity can be obtained.

The first insulating layer 38A and the second insulating layer 38B can be formed by using a known photolithography method. For example, after a resin layer is applied, a resist layer is arranged on the resin layer in a predetermined pattern to be exposed and developed, and the resin layer at an exposed portion where the resist layer is not arranged is removed by etching to form a pattern of the first insulating layer 38A or the second insulating layer 38B. A method of forming the first insulating layer 38A and the second insulating layer 38B is not limited to what is called a positive type in which the resin layer at the exposed portion is removed, and may be what is called a negative type in which the resin layer at the exposed portion is left as a pattern.

As illustrated in FIGS. 10 and 11, in a case in which any one of the first insulating layer 38A and the second insulating layer 38B is arranged for each region, the first insulating layer 38A is pattern-formed to be overlapped with the detection electrode region Rt and the frame region 10b, and thereafter, the second insulating layer 38B is pattern-formed to be overlapped with the dummy electrode region Rd. The embodiment is not limited thereto. The first insulating layer 38A may be pattern-formed after the second insulating layer 38B is pattern-formed.

As described above, in the display device 1A according to the first modification illustrated in FIG. 14, the second insulating layer 38B is arranged in the dummy electrode region Rd, and the first insulating layer 38A is arranged in the detection electrode region Rt and the dummy electrode region Rd while covering the second insulating layer 38B. In forming the first insulating layer 38A and the second insulating layer 38B, first, the second insulating layer 38B is pattern-formed by using the photolithography method, and the first insulating layer 38A is arranged across the entire surface of the detection electrode region Rt, the dummy electrode region Rd, and the frame region 10b. Accordingly, in the display device 1A according to the present modification, the processes of application, exposure, development, etching, and the like of the resist layer can be omitted for the first insulating layer 38A, so that a manufacturing process can be simplified and cost can be reduced.

Second Modification

Figure 15:
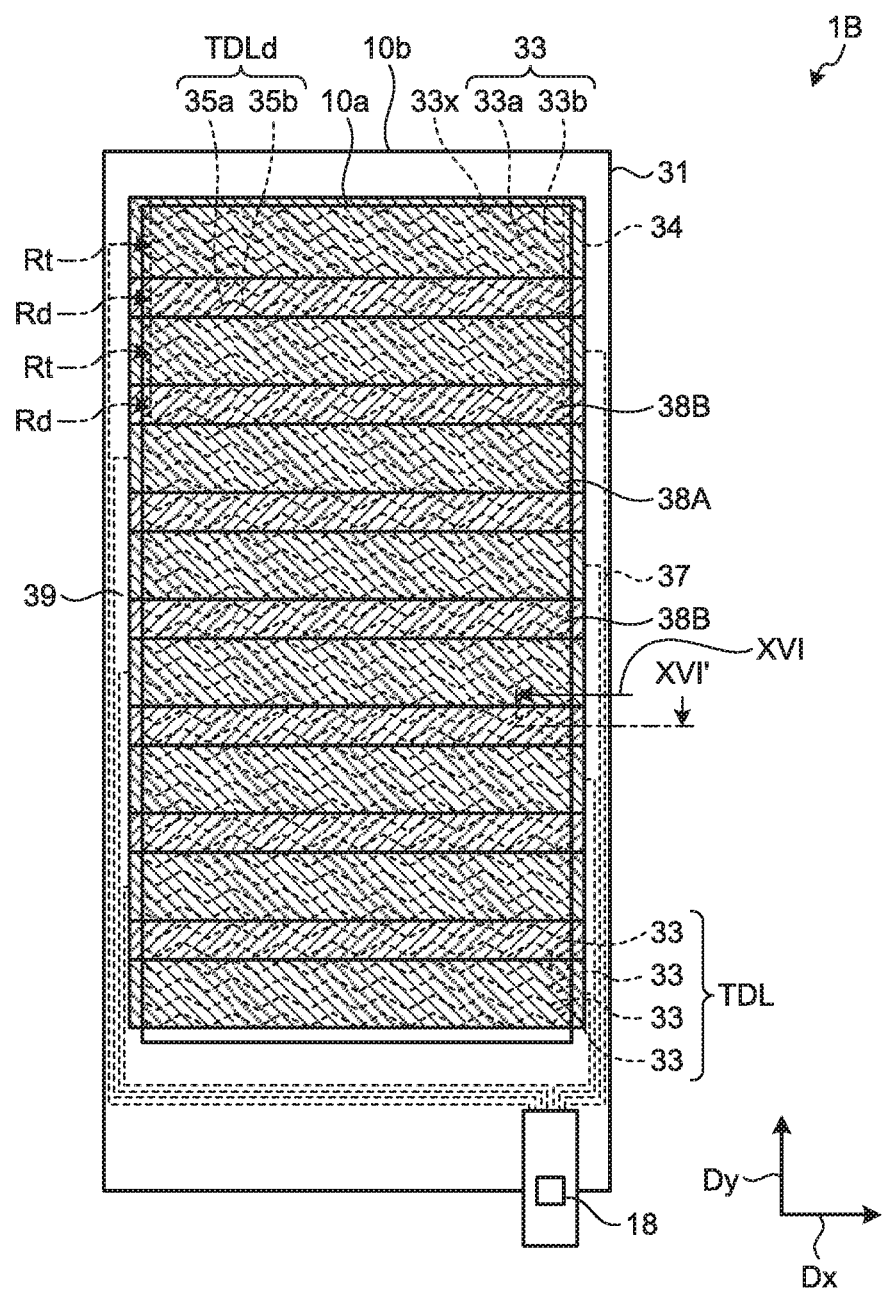
FIG. 15 is a plan view schematically illustrating a second substrate according to a second modification of the first embodiment.
Figure 16:
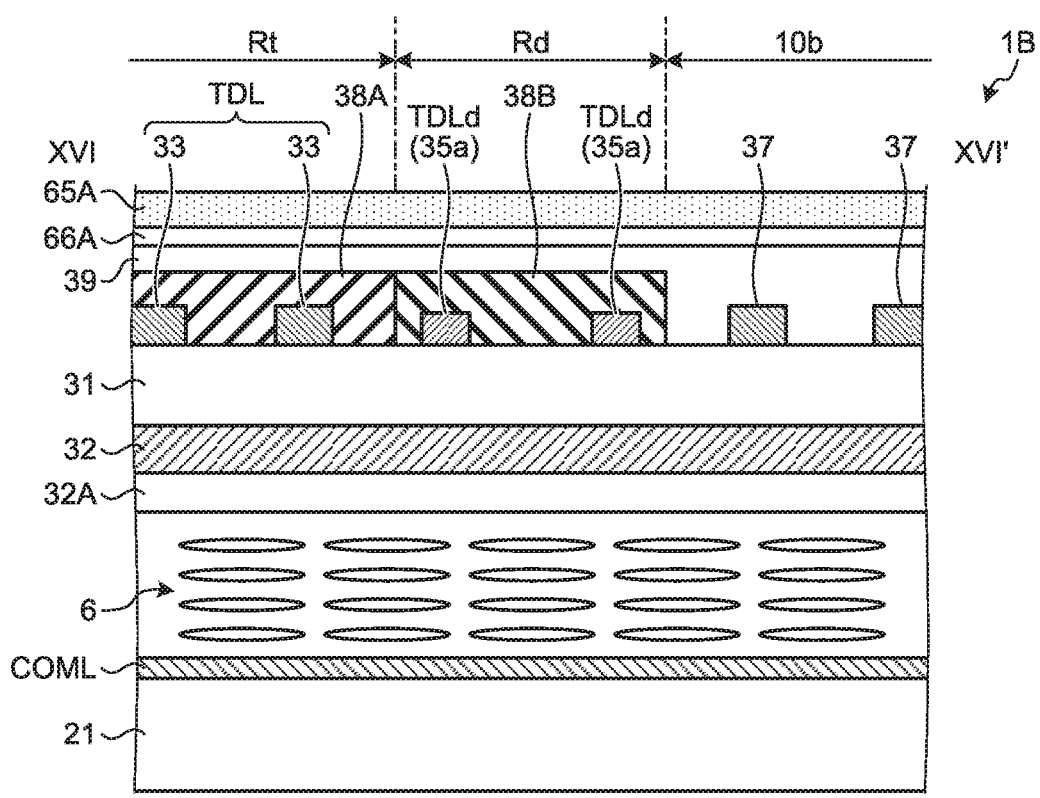
FIG. 16 is a cross-sectional view along the line XVI-XVI' in FIG. 15.

FIG. 15 is a plan view schematically illustrating the second substrate according to a second modification of the first embodiment. FIG. 16 is a cross-sectional view along the line XVI-XVI' in FIG. 15. A display device 1B according to the present modification is different from the display devices 1 and 1A described above in that the first insulating layer 38A is not arranged at the position superimposed on the frame wiring 37. Also in the present modification, in the display region 10a, the first insulating layer 38A is arranged at the position superimposed on the detection electrode TDL, and the second insulating layer 38B is arranged at the position superimposed on the dummy electrode TDLd. Accordingly, the fringe electric field Ef passes through the dummy electrode region Rd to extend upward, and good detection sensitivity can be obtained.

As illustrated in FIG. 16, in the present modification, an overcoat layer 39 is arranged in the frame region 10b while covering the frame wiring 37. The overcoat layer 39 may be continuously arranged over the first insulating layer 38A and the second insulating layer 38B in the display region 10a. By arranging the overcoat layer 39, a level difference can be reduced to flatten a portion where the first insulating layer 38A and the second insulating layer 38B are arranged and the frame region 10b in which the first insulating layer 38A is not arranged.

As the overcoat layer 39, for example, a translucent resin material such as an acrylic resin is used. In the present modification, the first relative dielectric constant of the first insulating layer 38A is smaller than the relative dielectric constant of the overcoat layer 39, and the second relative dielectric constant of the second insulating layer 38B is equal to or larger than the relative dielectric constant of the overcoat layer 39.

Third Modification

Figure 17:
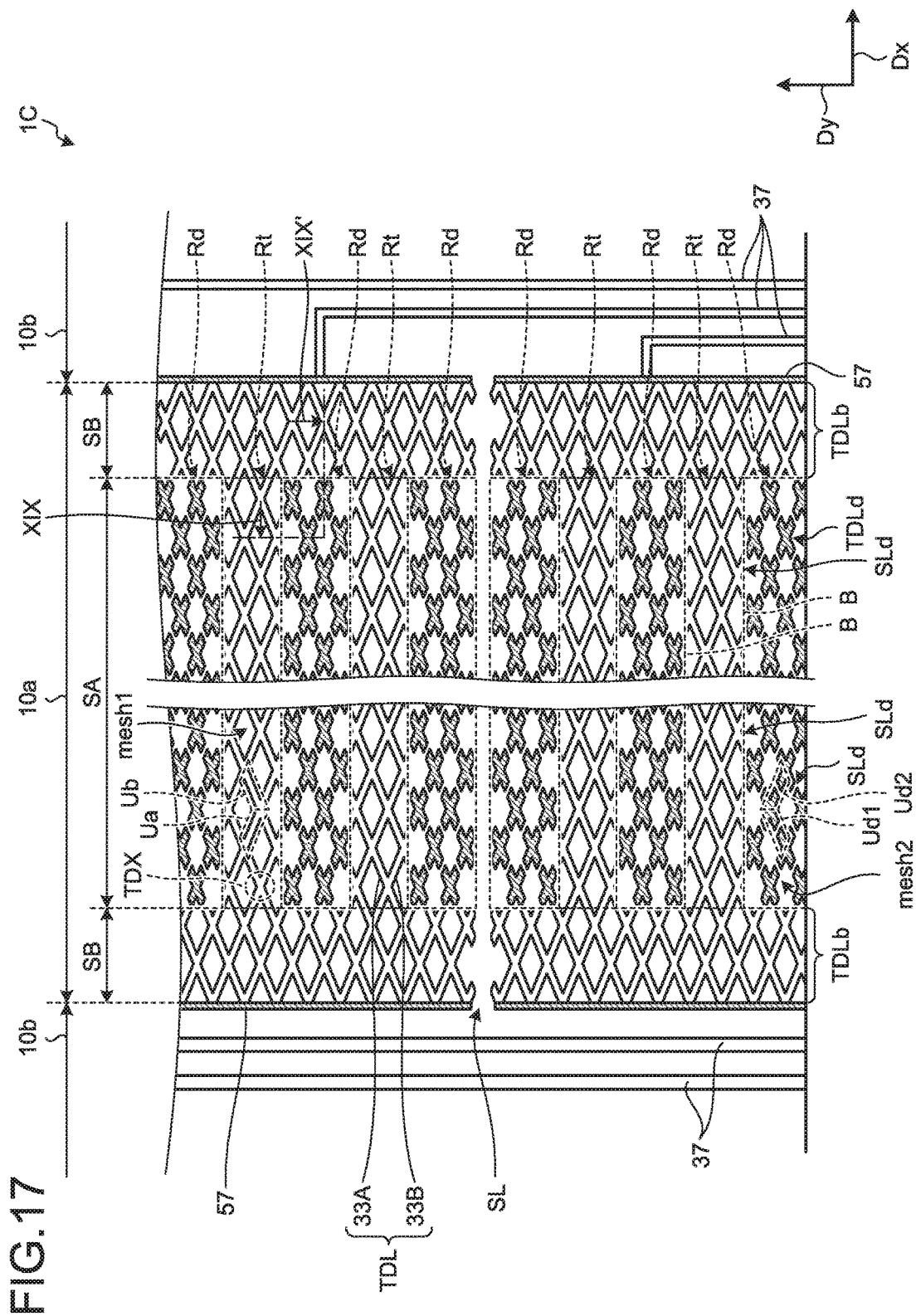
FIG. 17 is a plan view illustrating a configuration example of a detection electrode according to a third modification of the first embodiment.
Figure 18:
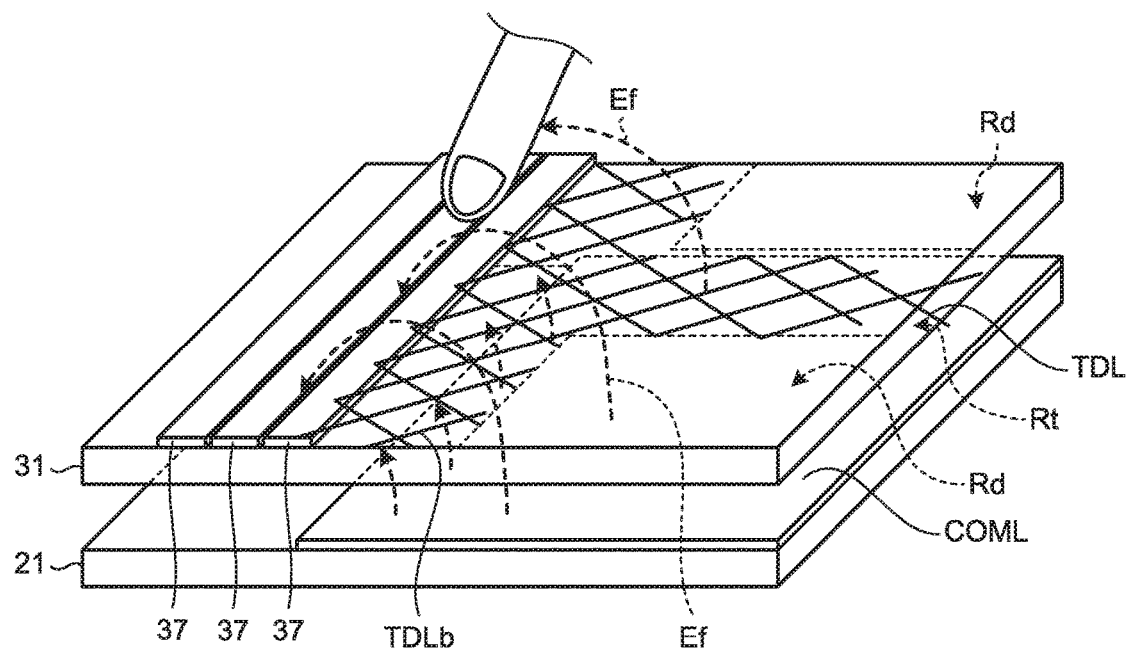
FIG. 18 is a perspective view for schematically explaining a fringe electric field between the drive electrode and frame wiring.
Figure 19:
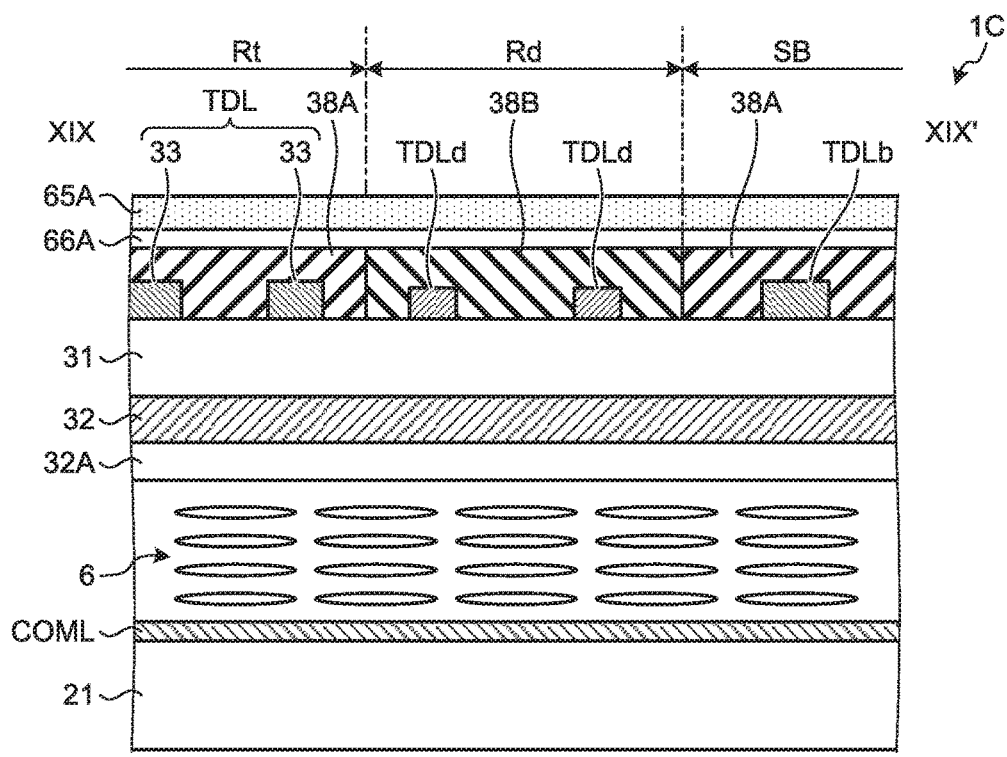
FIG. 19 is a cross-sectional view along the line XIX-XIX' in FIG. 17.

FIG. 17 is a plan view illustrating a configuration example of the detection electrode according to a third modification of the first embodiment. FIG. 18 is a perspective view for schematically explaining the fringe electric field between the drive electrode and the frame wiring. FIG. 19 is a cross-sectional view along the line XIX-XIX' in FIG. 17.

As illustrated in FIG. 17, in a display device 1C according to the present modification, a plurality of detection electrodes TDL are arranged in the second direction Dy, and the dummy electrode TDLd is arranged between the detection electrodes TDL. The detection electrode region Rt in which the detection electrode TDL is arranged and the dummy electrode region Rd in which the dummy electrode TDLd is arranged have a rectangular shape having a long side in a direction along the first direction Dx. Connecting parts TDLb along the second direction Dy are arranged on both ends of the detection electrode TDL. A plurality of detection electrodes TDL are coupled to each other via the connecting parts TDLb. The connecting parts TDLb are separated from each other by a slit SL, and are arranged in the second direction Dy. The frame wiring 37 is coupled to the connecting part TDLb via a pad part 57. In the present modification, the detection electrodes TDL coupled to each other via the connecting part TDLb function as one detection electrode.

As illustrated in FIG. 17, in the first direction Dx, a region overlapped with the detection electrode TDL and the dummy electrode TDLd is an effective detection region SA, and a region overlapped with the connecting part TDLb is a peripheral region SB having detection sensitivity lower than that in the effective detection region SA.

The detection electrode TDL includes wiring 33A and wiring 33B that are made of metal. The wiring 33A and the wiring 33B are line symmetric with respect to a straight line parallel with the first direction Dx as a symmetric axis, and are alternately arranged in the second direction Dy. Bending parts of a plurality of pieces of wiring 33A and a plurality of pieces of wiring 33B arranged in the second direction Dy are connected to each other to form an intersecting part TDX. The wiring 33A and the wiring 33B are conducted at the intersecting part TDX. With such a configuration, the wiring 33A and the wiring 33B form a surrounded region mesh1 surrounded by a thin wire piece Ua and a thin wire piece Ub, and mesh-like wiring is arranged in the display region 10a.

The connecting part TDLb includes a plurality of pieces of wiring continuous to the wiring 33A and the wiring 33B of the detection electrode TDL. That is, the connecting part TDLb also forms the surrounded region mesh1 surrounded by the thin wire piece Ua and the thin wire piece Ub to provide mesh-like wiring.

The pieces of wiring 33A and 33B are separated by a slit SLd arranged at a position indicated by the dotted line B in FIG. 17. The dummy electrode TDLd is a portion separated from the detection electrode TDL and the connecting part TDLb by the slit SLd, and surrounded by the detection electrode TDL and the connecting part TDLb. The dummy electrode TDLd is a dummy electrode that does not function as the detection electrode.

In the dummy electrode TDLd, a thin wire piece Ud1 and a thin wire piece Ud2 are repeatedly coupled to each other in the first direction Dx and the second direction Dy. The dummy electrode TDLd forms a mesh-like pattern including a surrounded region mesh2 surrounded by the thin wire piece Ud1 and the thin wire piece Ud2. The slit SLd is arranged in the middle of the thin wire piece Ud1 and of the thin wire piece Ud2. The slit SLd may be arranged at an intersecting part of the thin wire piece Ud1 and the thin wire piece Ud2.

As illustrated in FIG. 17, the frame wiring 37 is arranged in the vicinity of the display region 10a along the second direction Dy. Accordingly, as illustrated in FIG. 18, the fringe electric field Ef may be generated between the drive electrode COML arranged on the first substrate 21 and the frame wiring 37 in some cases. When the external object is brought into contact with or proximate to the frame wiring 37, the fringe electric field Ef is blocked, so that capacitance is changed. When this change in capacitance is output to the detector 40 (refer to FIG. 1) via the frame wiring 37, the frame wiring 37 functions as the detection electrode, and erroneous detection may be caused.

In the present modification, the connecting part TDLb is arranged, so that the connecting part TDLb functions as a shield that shields the fringe electric field Ef between the drive electrode COML and the frame wiring 37. Accordingly, the fringe electric field Ef can be reduced to prevent erroneous detection. The connecting part TDLb functions as the shield, and also functions as a detection electrode that detects a finger and the like that is brought into contact with or proximate to the connecting part TDLb.

As illustrated in FIG. 19, the first insulating layer 38A is arranged at a position superimposed on the detection electrode TDL in the detection electrode region Rt, and the second insulating layer 38B is arranged at a position superimposed on the dummy electrode TDLd in the dummy electrode region Rd. In the present modification, the first insulating layer 38A is arranged at a position superimposed on the connecting part TDLb in the peripheral region SB. The first insulating layer 38A has a relative dielectric constant smaller than that of the second insulating layer 38B, so that the fringe electric field Ef passing through the peripheral region SB is suppressed, and a shield effect due to the connecting part TDLb is improved. Thus, the display device 1C according to the present modification can prevent the frame wiring 37 from functioning as the detection electrode, thereby improving the detection performance.

The touch panel 30 (detection device) according to the present embodiment can be configured as follows. The touch panel 30 according to the present embodiment includes the detection electrode TDL (first electrode) and the drive electrode COML (second electrode) opposed to the detection electrode TDL, and contact or proximity of an external object is detected based on a change in the capacitance generated between the detection electrode TDL and the drive electrode COML. In the insulating layer 38, the first insulating layer 38A is arranged at the portion superimposed on the detection electrode TDL, and the second insulating layer 38B is arranged at the portion not superimposed on the detection electrode TDL.

In the insulating layer 38 of the touch panel 30 according to the present embodiment, the first insulating layer 38A is arranged at the portion superimposed on the detection electrode TDL, and the first insulating layer 38A and the second insulating layer 38B are laminated on the portion not superimposed on the detection electrode TDL.

The detection electrode TDL is arranged along the first direction Dx, and a plurality of detection electrodes TDL are arranged in the second direction Dy. The dummy electrode TDLd that does not function as an electrode for detection is arranged between the detection electrodes TDL. In the insulating layer 38, the second insulating layer 38B is arranged at the portion superimposed on the dummy electrode TDLd.

The touch panel 30 according to the present embodiment includes the connecting part TDLb that connects the ends of a plurality of detection electrodes TDL arranged in the second direction Dy. In the insulating layer 38, the first insulating layer 38A is arranged at the position superimposed on the connecting part TDLb.

The touch panel 30 according to the present embodiment includes the frame wiring 37 that is coupled to the detection electrode TDL and arranged in the frame region 10b outside the display region 10a. In the insulating layer 38, the first insulating layer 38A is arranged at the portion superimposed on the frame wiring 37.

Examples

Figure 20:
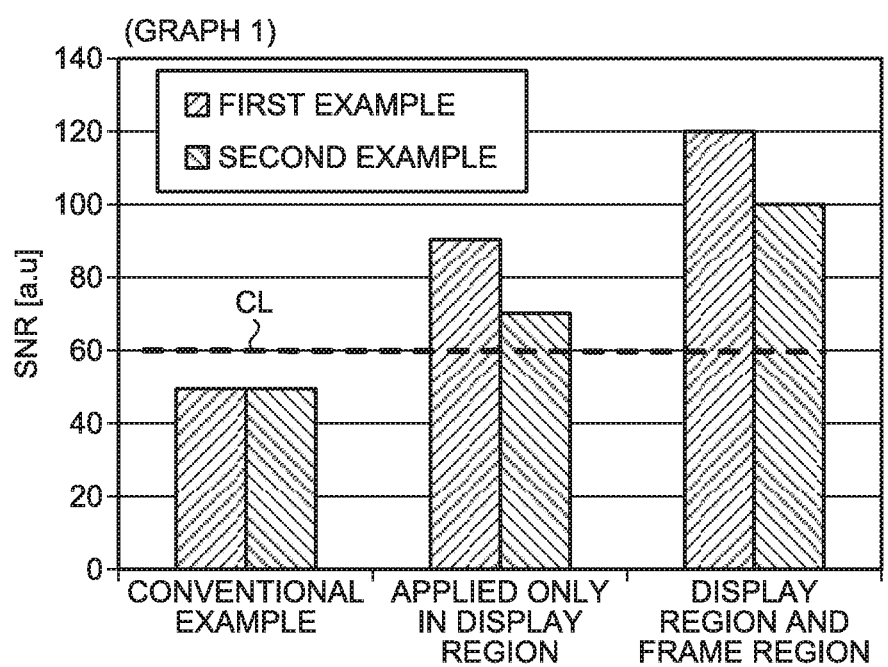
FIG. 20 is a graph representing an SN ratio (SNR) of the display device according to a first example and a second example.

FIG. 20 is a graph representing the SN ratio (SNR) of the display device according to a first example and a second example. A conventional example illustrated in the graph 1 in FIG. 20 represents a display device obtained by arranging, in the display device 1 according to the first embodiment, an overcoat layer having a uniform relative dielectric constant at a position superimposed on the detection electrode TDL and the dummy electrode TDLd without arranging the first insulating layer 38A and the second insulating layer 38B. A configuration thereof except the insulating layer is similar to that of the display device 1 illustrated in FIG. 5 to FIG. 13. The first example is a configuration similar to that of the display device 1 according to the first embodiment illustrated in FIG. 5 to FIG. 13. The second example is a configuration in which the first insulating layer 38A and the second insulating layer 38B are laminated in the dummy electrode region Rd similarly to the display device 1A according to the first modification illustrated in FIG. 14. For the first example and the second example, the SN ratio (SNR) is calculated for a case in which the first insulating layer 38A and the second insulating layer 38B are arranged only in the display region 10a (refer to FIG. 15) and a case in which the first insulating layer 38A and the second insulating layer 38B are arranged in both the display region 10a and the frame region 10b (refer to FIG. 10).

As illustrated in FIG. 20, the display device according to the conventional example has the SN ratio lower than a reference value CL. In contrast, each of the display devices according to the first example and the second example has the SN ratio higher than the reference value CL. The SN ratio in the first example is higher than that of the display device according to the second example. This is because, in the display device according to the first example, the second insulating layer 38B is arranged as a single layer in the dummy electrode region Rd (refer to FIG. 12), so that the relative dielectric constant becomes higher than that in a case in which the first insulating layer 38A and the second insulating layer 38B are laminated according to the second example (refer to FIG. 14), and the reachable range of the electric line of force is enlarged.

When the first insulating layer 38A is arranged in the frame region 10b, the SN ratio is further improved as compared with a case in which the first insulating layer 38A is arranged only in the display region 10a. Accordingly, it is shown that external noise is prevented from entering the frame wiring 37 by arranging the first insulating layer 38A in the frame region 10b.

As described above, it is shown that the display device according to the first example and the second example can improve detection performance by arranging the first insulating layer 38A at the position superimposed on the detection electrode TDL and arranging the second insulating layer 38B at the position not superimposed on the detection electrode TDL, that is, the position superimposed on the dummy electrode TDLd. Additionally, the display device according to the first example and the second example can suppress noise to improve detection performance by arranging the first insulating layer 38A at the position superimposed on the frame wiring 37.

Second Embodiment

Figure 21:
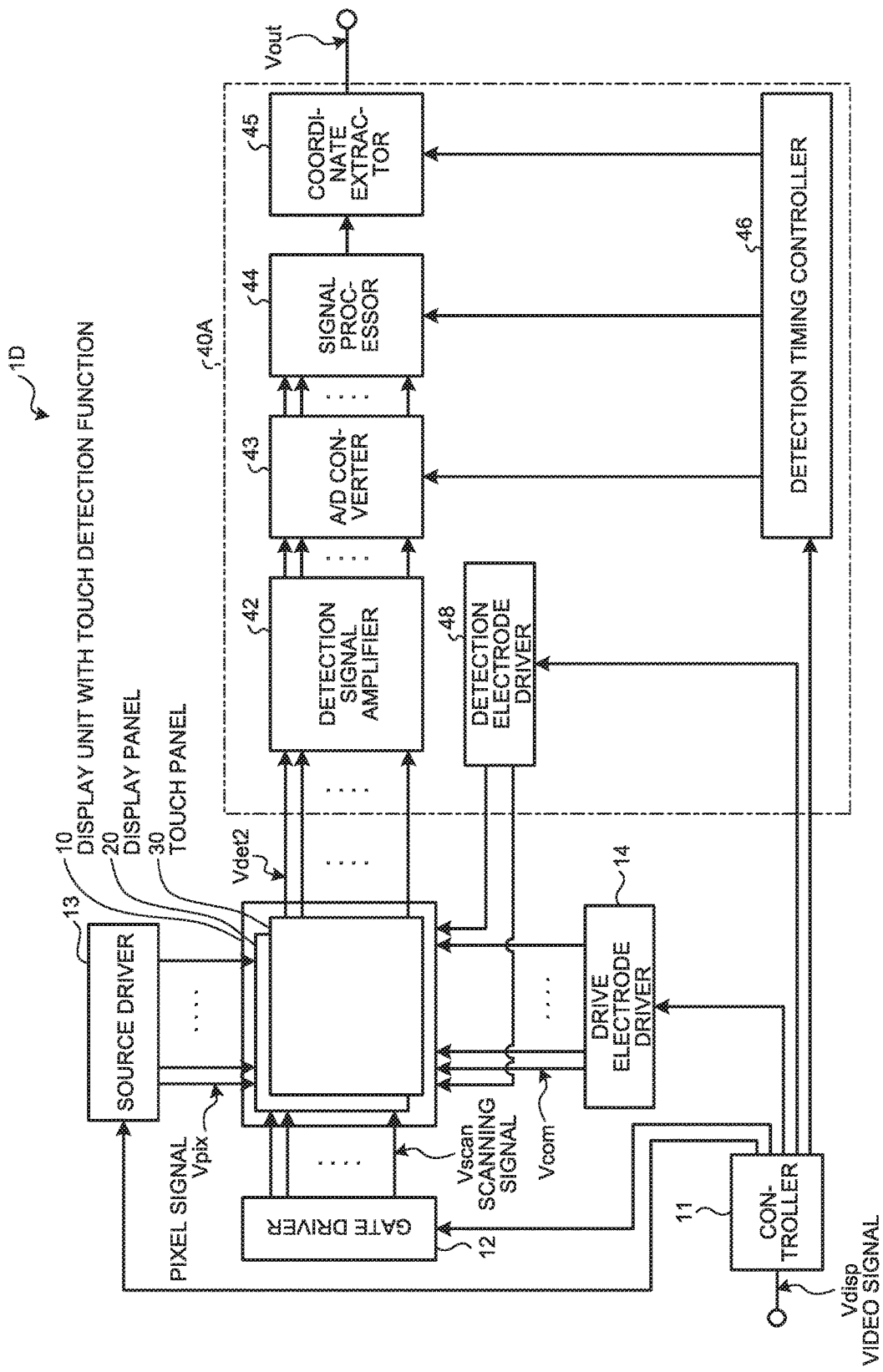
FIG. 21 is a block diagram illustrating a configuration example of a display device according to a second embodiment.

FIG. 21 is a block diagram illustrating a configuration example of the display device according to a second embodiment. In the present embodiment, the same component as that described above may be denoted by the same reference numeral, and detailed description thereof will not be repeated in some cases. In a display device 1D according to the present embodiment, the touch panel 30 is configured to perform self-capacitance touch detection.

As illustrated in FIG. 21, a detector 40A includes a detection electrode driver 48. The detection electrode driver 48 is a circuit that supplies a drive signal to a detection electrode TDLs in a touch detection operation based on a control signal supplied from the controller 11. In the present embodiment, the drive electrode driver 14 supplies the drive signal Vcom for display to the drive electrode COML in a display operation.

Figure 22:
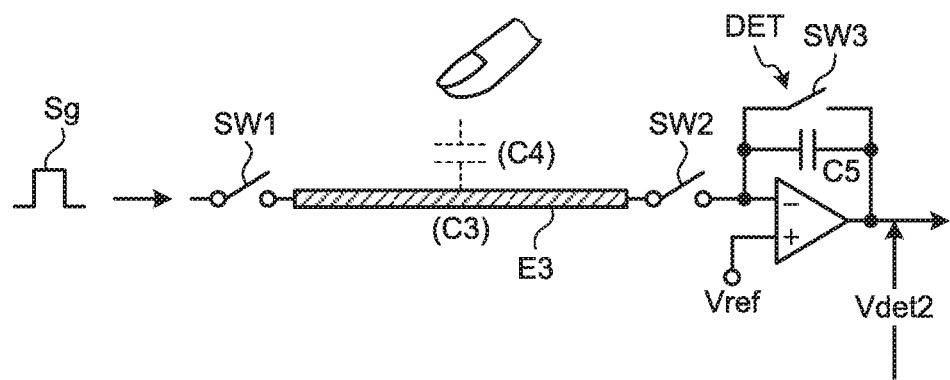
FIG. 22 is an explanatory diagram for explaining a basic principle of self-capacitance touch detection.
Figure 23:
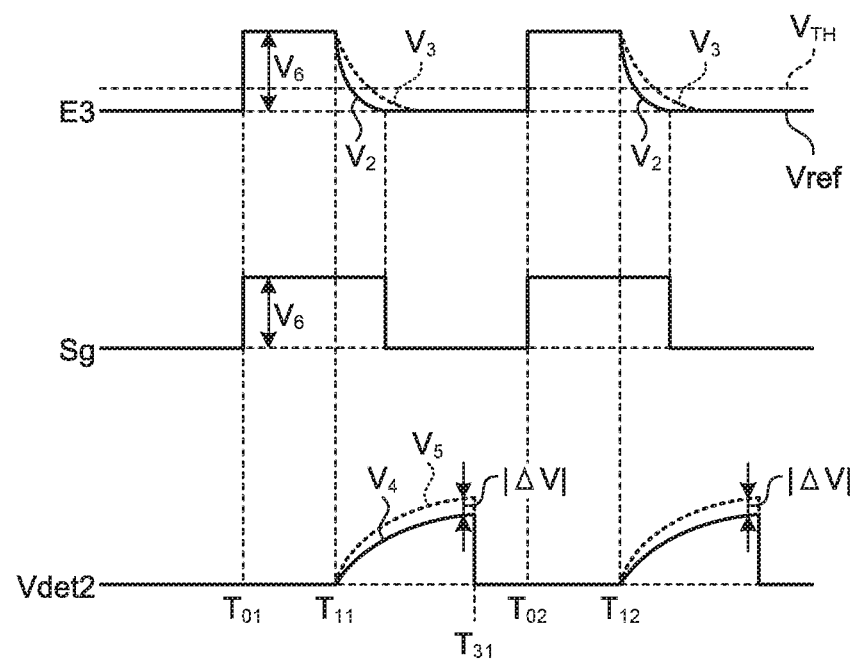
FIG. 23 is a diagram representing an example of waveforms of a drive signal and a detection signal of self-capacitance touch detection.

Next, the following describes a basic principle of self capacitance touch detection of the display device 1D according to the present embodiment with reference to FIGS. 22 and 23. FIG. 22 is an explanatory diagram for explaining the basic principle of self-capacitance touch detection. FIG. 23 is a diagram representing an example of waveforms of a drive signal and a detection signal of self-capacitance touch detection. FIG. 22 also illustrates a detection circuit.

In a state in which a finger is neither in contact with nor proximate to a detection electrode E3, the AC rectangular wave Sg having a predetermined frequency (for example, about several kilohertz to several hundreds of kilohertz) is applied to the detection electrode E3. The detection electrode E3 has capacitance C3, and a current corresponding to the capacitance C3 flows therethrough. The voltage detector DET converts a variation in the current corresponding to the AC rectangular wave Sg into a variation in voltage (a waveform $V_4$ of a solid line (refer to FIG. 23)).

Next, as illustrated in FIG. 22, in a state in which a finger (external object) is in contact with or proximate to the detection electrode E3, capacitance C4 between the finger and the detection electrode E3 is added to the capacitance C3 of the detection electrode E3. Accordingly, when the AC rectangular wave Sg is applied to the detection electrode E3, a current corresponding to the capacitance C3 and the capacitance C4 flows therethrough. As illustrated in FIG. 23, the voltage detector DET converts a variation in the current corresponding to the AC rectangular wave Sg into a variation in voltage (a waveform $V_5$ of a dotted line). Thus, it can be measured whether there is an external proximity object (whether there is a touch) based on an absolute value $|\Delta V|$ of a difference between the waveform $V_4$ and the waveform $V_5$.

Specifically, in FIG. 23, a voltage level of the AC rectangular wave Sg corresponding to voltage $V_6$ is increased at a timing of time $T_{01}$. At this point, a switch SW1 is in an ON state, and a switch SW2 is in an OFF state. Due to this, the voltage corresponding to the voltage $V_6$ is increased also in the detection electrode E3. Next, the switch SW1 is turned OFF before the timing of time $T_{11}$. At this point, the detection electrode E3 is in a floating state, but electric potential of the detection electrode E3 is maintained at $V_6$ due to the capacitance C3 of the detection electrode E3 or the capacitance (C3+C4, refer to FIG. 22). Additionally, a reset operation of the voltage detector DET is performed before the timing of time $T_{11}$, and an output voltage is caused to be substantially the same voltage as Vref.

Subsequently, when the switch SW2 is turned ON at the timing of time $T_{11}$, electric charges accumulated in the capacitance C3 (or C3+C4) move to the capacitance C5 in the voltage detector DET. Accordingly, an output of the voltage detector DET is increased (refer to a second detection signal Vdet2 in FIG. 23). When the finger is not proximate to the detection electrode E3, the output (second detection signal Vdet2) of the voltage detector DET is the waveform $V_4$ represented by a solid line, and Vdet2=C3× $V_6$/C5 is satisfied. When the capacitance is added due to influence of the finger, the output (second detection signal Vdet2) is the waveform $V_5$ represented by a dotted line, and Vdet2=(C3+C4)×$V_6$/C5 is satisfied.

Thereafter, the switch SW2 is turned OFF and the switch SW1 and the switch SW3 are turned ON at the timing of time $T_{31}$. Due to this, the electric potential of the detection electrode E3 is caused to be at a low level, which is the same electric potential as that of the AC rectangular wave Sg, and the voltage detector DET is reset. The operations described above are repeated at a predetermined frequency (for example, about several kilohertz to several hundreds of kilohertz).

Figure 24:
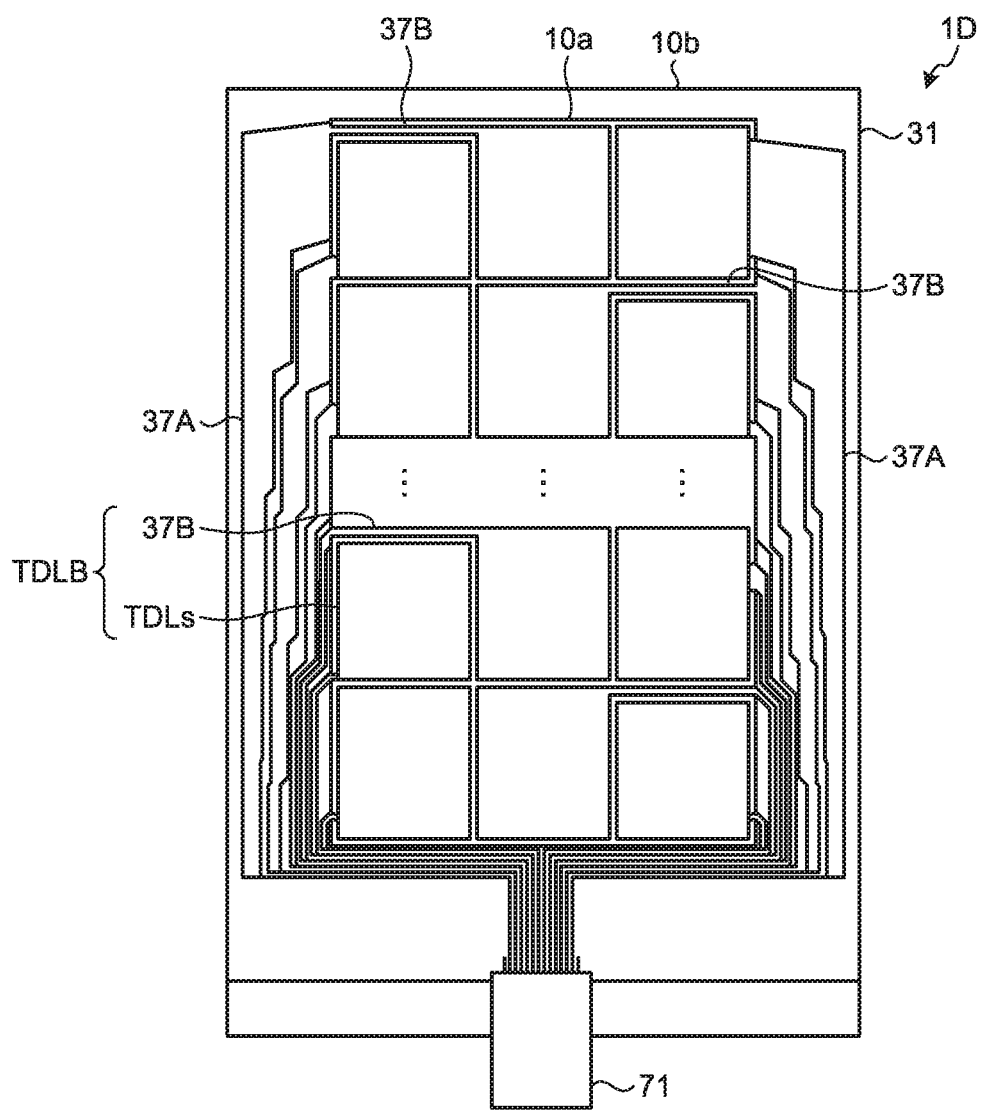
FIG. 24 is a plan view schematically illustrating a second substrate of the display device according to the second embodiment.

FIG. 24 is a plan view schematically illustrating the second substrate of the display device according to the second embodiment. In the present embodiment, a detection electrode layer TDLB is arranged in the display region 10a of the second substrate 31. The detection electrode layer TDLB includes a detection electrode TDLs and a coupling wiring 37B.

A plurality of detection electrodes TDLs are arranged in a matrix (a row-column configuration) in the display region 10a. Among the detection electrodes TDLs, the detection electrode TDLs arranged in the vicinity of the long side of the frame region 10b is coupled to frame wiring 37A. The detection electrode TDLs arranged on the center side of the display region 10a is coupled to the frame wiring 37A via the coupling wiring 37B. The coupling wiring 37B is arranged in the same layer as the detection electrode TDLs, and passes through adjacent detection electrodes TDLs to be coupled to the frame wiring 37A in the frame region 10b.

The frame wiring 37A is arranged in the frame region 10b, and coupled to the flexible substrate 71 that is coupled to the short side of the frame region 10b. The width of the frame wiring 37A increases as being separated away from the short side of the frame region 10b in which the flexible substrate 71 is arranged.

The detection electrode driver 48 (refer to FIG. 21) supplies a drive signal to the detection electrode TDLs via the frame wiring 37A. The second detection signal Vdet2 is output from the detection electrode TDLs to the detector 40A. The detection electrode TDLs corresponds to the detection electrode E3 in the basic principle of self-capacitance touch detection described above. Each of the detection electrodes TDLs functions as a capacitance touch sensor. The detection electrodes TDLs are arranged in a matrix, so that a contact position or a proximate position of an external object can be detected by simultaneously or sequentially performing touch detection on the detection electrodes TDLs.

Figure 25:
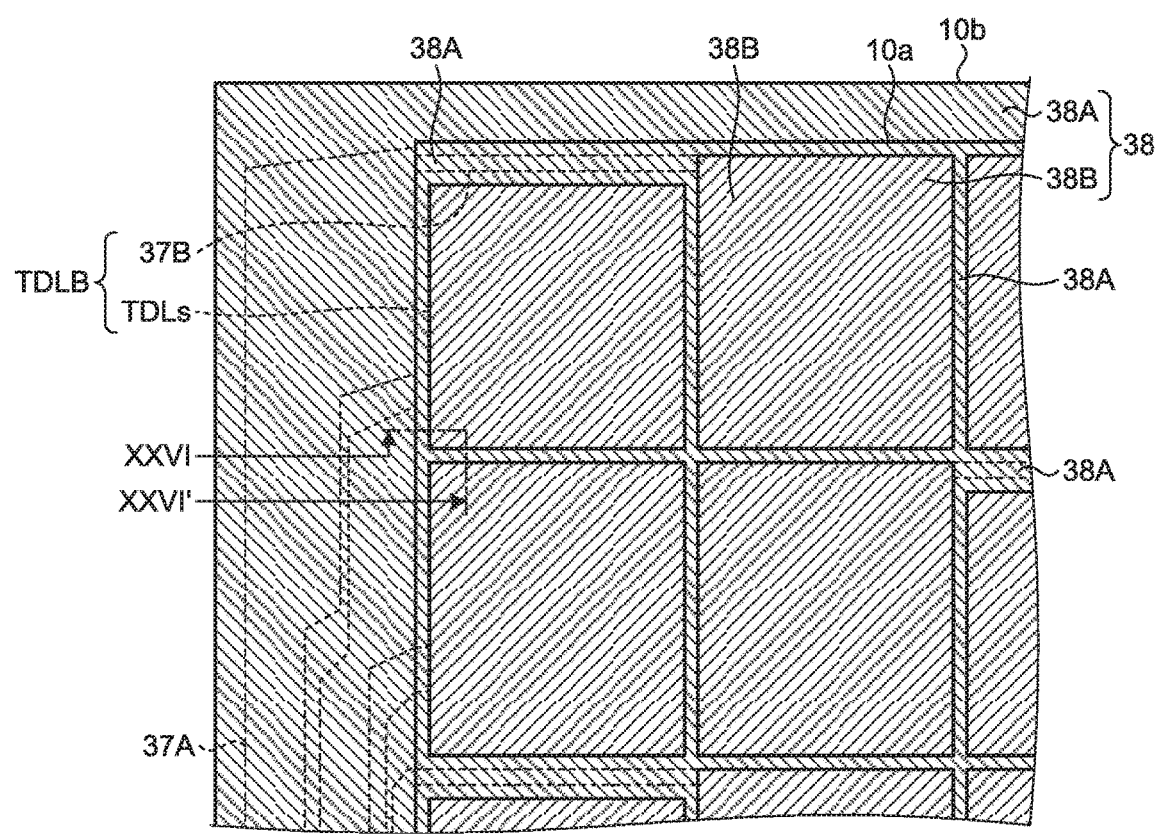
FIG. 25 is a partially enlarged plan view for explaining an arrangement relation between an insulating layer and a detection electrode layer according to the second embodiment.
Figure 26:
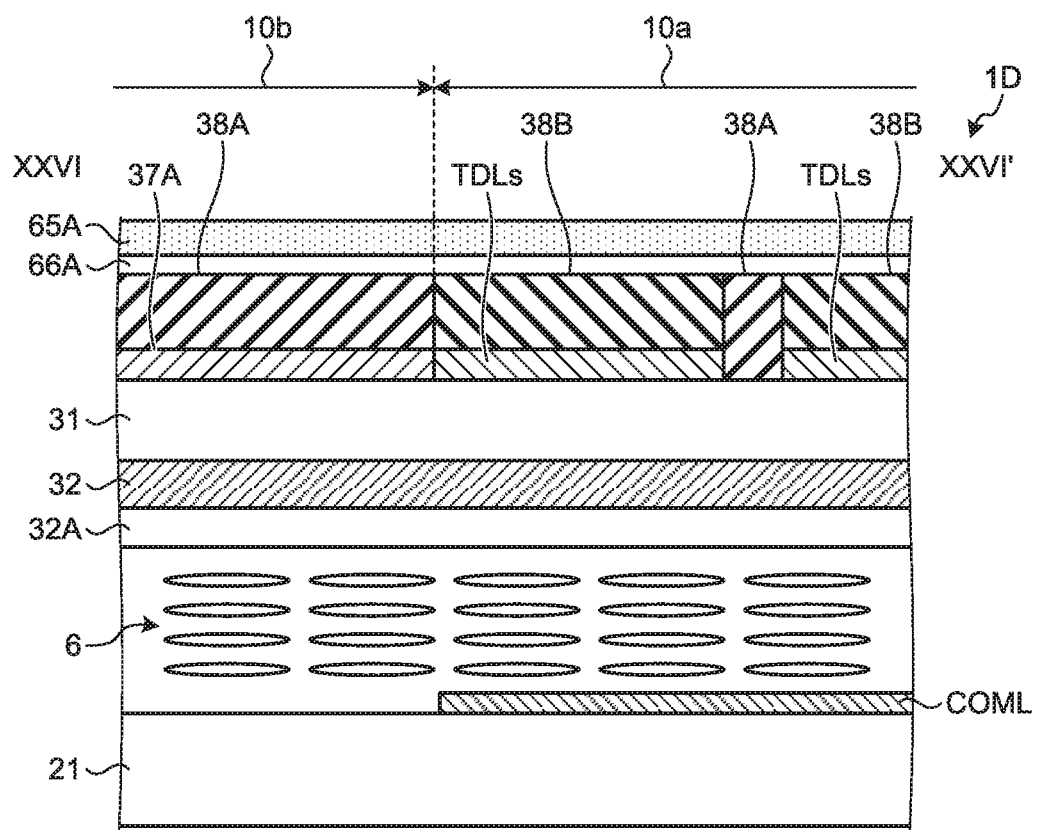
FIG. 26 is a cross-sectional view along the line XXVI-XXVI' in FIG. 25.

FIG. 25 is a partially enlarged plan view for explaining an arrangement relation between the insulating layer and the detection electrode layer according to the second embodiment. FIG. 26 is a cross-sectional view along the line XXVI-XXVI' in FIG. 25. As illustrated in FIG. 25, the insulating layer 38 is arranged across the display region 10a and the frame region 10b while covering the detection electrode layer TDLB and the frame wiring 37A. The insulating layer 38 includes the first insulating layer 38A and the second insulating layer 38B similarly to the first embodiment. The first insulating layer 38A has the first relative dielectric constant, and the second insulating layer 38B has the second relative dielectric constant larger than the first relative dielectric constant. For example, the first relative dielectric constant is smaller than 3.5, and the second relative dielectric constant is equal to or larger than 3.5.

In the insulating layer 38 according to the present embodiment, in the display region 10a, the second insulating layer 38B is arranged at a position superimposed on the detection electrode TDLs, and the first insulating layer 38A is arranged at a position not superimposed on the detection electrode TDLs, that is, at a position superimposed on the coupling wiring 37B and between adjacent detection electrodes TDLs. In the frame region 10b, the first insulating layer 38A of the insulating layer 38 is arranged at a position superimposed on the frame wiring 37A.

FIG. 26 is a cross-sectional view illustrating the vicinity of a boundary between the display region 10a and the frame region 10b of the display device 1D. As illustrated in FIG. 26, the second insulating layer 38B is arranged on the detection electrode TDLs. The first insulating layer 38A is arranged between the detection electrodes TDLs. The first insulating layer 38A is arranged on the frame wiring 37A. Although not illustrated in FIG. 26, the first insulating layer 38A is arranged on the coupling wiring 37B in the display region 10a. The first insulating layer 38A and the second insulating layer 38B are arranged while the side surfaces thereof are in contact with each other.

Although FIG. 26 does not illustrate the pixel electrode 22, a plurality of pixel electrodes 22 are arranged via the drive electrode COML and the insulating layer 24 similarly to the display device 1 according to the first embodiment illustrated in FIG. 5.

Figure 27:
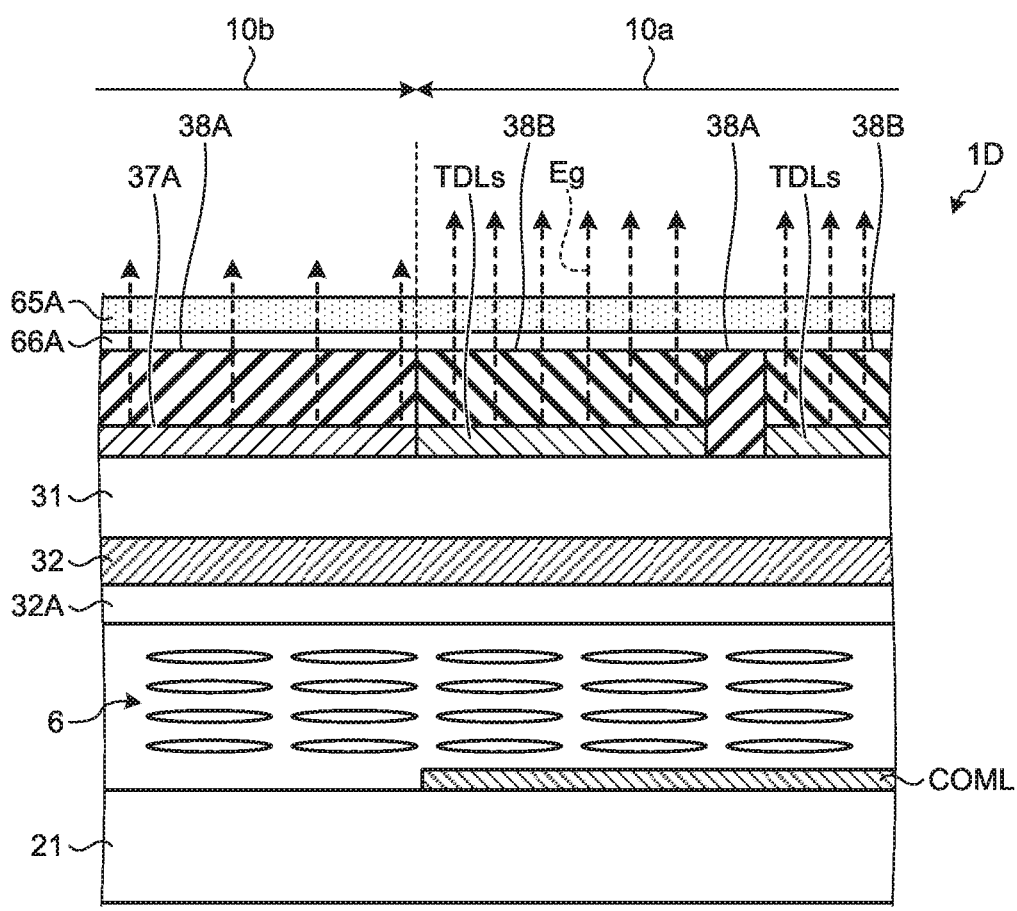
FIG. 27 is a cross-sectional view for schematically explaining an electric field generated from the detection electrode.

FIG. 27 is a cross-sectional view for schematically explaining an electric field generated from the detection electrode. FIG. 27 schematically illustrates, by a dotted line, an electric line of force of an electric field Eg that is generated from the detection electrode TDLs when the drive signal is supplied to the detection electrode TDLs. FIG. 27 also illustrates the electric field Eg generated from the frame wiring 37A. In the present embodiment, the second insulating layer 38B having a relative dielectric constant which is relatively high is arranged at a position superimposed on the detection electrode TDLs. Thus, the electric line of force of the electric field Eg passing through the second insulating layer 38B reaches a farther upward position, and a reachable range of the electric line of force is enlarged.

On the other hand, the first insulating layer 38A having a relative dielectric constant which is relatively low is arranged at a position not superimposed on the detection electrode TDLs, so that the reachable range of the electric line of force of the electric field Eg is made smaller, the electric line of force of the electric field Eg passing through the first insulating layer 38A arranged on the frame wiring 37A and the coupling wiring 37B (refer to FIG. 25). Accordingly, even when the external object is brought into contact with or proximate to the frame wiring 37A and the coupling wiring 37B, capacitance generated between the external object and the frame wiring 37A is reduced. Similarly, capacitance generated between the external object and the coupling wiring 37B is reduced. Thus, the frame wiring 37A and the coupling wiring 37B can be prevented from functioning as the detection electrode, thereby improving detection performance.

The first insulating layer 38A is arranged at a portion superimposed on the frame wiring 37A and the coupling wiring 37B, so that entry of external noise can be prevented. As a result, the SN ratio can be improved.

First Modification of Second Embodiment

Figure 28:
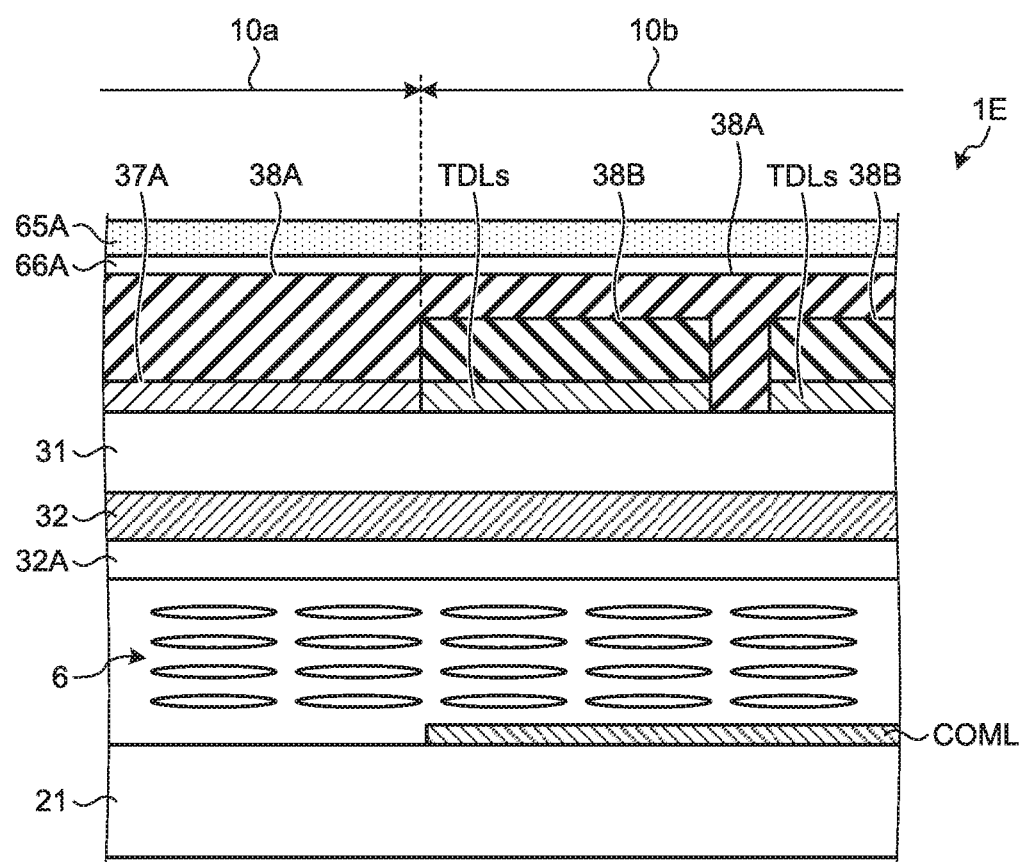
FIG. 28 is a cross-sectional view illustrating a laminated structure of an insulating layer of a display device according to a first modification of the second embodiment.

FIG. 28 is a cross-sectional view illustrating a laminated structure of the insulating layer of the display device according to a first modification of the second embodiment. In a display device 1E according to the present modification, one first insulating layer 38A is arranged at a position superimposed on the frame wiring 37A and between the detection electrodes TDLs. The second insulating layer 38B having a relative dielectric constant which is relatively high is arranged on the detection electrode TDLs. The first insulating layer 38A having a relative dielectric constant which is relatively low is arranged on the second insulating layer 38B. The first insulating layer 38A covers the second insulating layer 38B and is continuously arranged across the frame wiring 37A and a gap between the detection electrodes TDLs. The first insulating layer 38A is arranged while covering the coupling wiring 37B that is not illustrated in FIG. 28.

Even in such an aspect, the relative dielectric constant at the portion superimposed on the detection electrode TDLs is larger than the relative dielectric constant at a portion not superimposed on the detection electrode TDLs, so that the electric field Eg passes through the second insulating layer 38B arranged on the detection electrode TDLs to extend upward similarly to the explanatory diagram of FIG. 27, electric field intensity is increased, and good detection sensitivity can be obtained.

In the present modification, in forming the first insulating layer 38A and the second insulating layer 38B, the second insulating layer 38B is pattern-formed by using the photolithography method, and thereafter, the first insulating layer 38A is arranged on the entire surface of the display region 10a and the frame region 10b. Thus, in the display device 1E according to the present modification, the process of pattern-forming the first insulating layer 38A can be omitted, so that the manufacturing process can be simplified and the cost can be reduced. In this case, the thickness of the first insulating layer 38A in the frame region 10b is smaller than the thickness of the first insulating layer 38A in the display region 10a as illustrated in FIG. 28.

Second Modification of Second Embodiment

Figure 29:
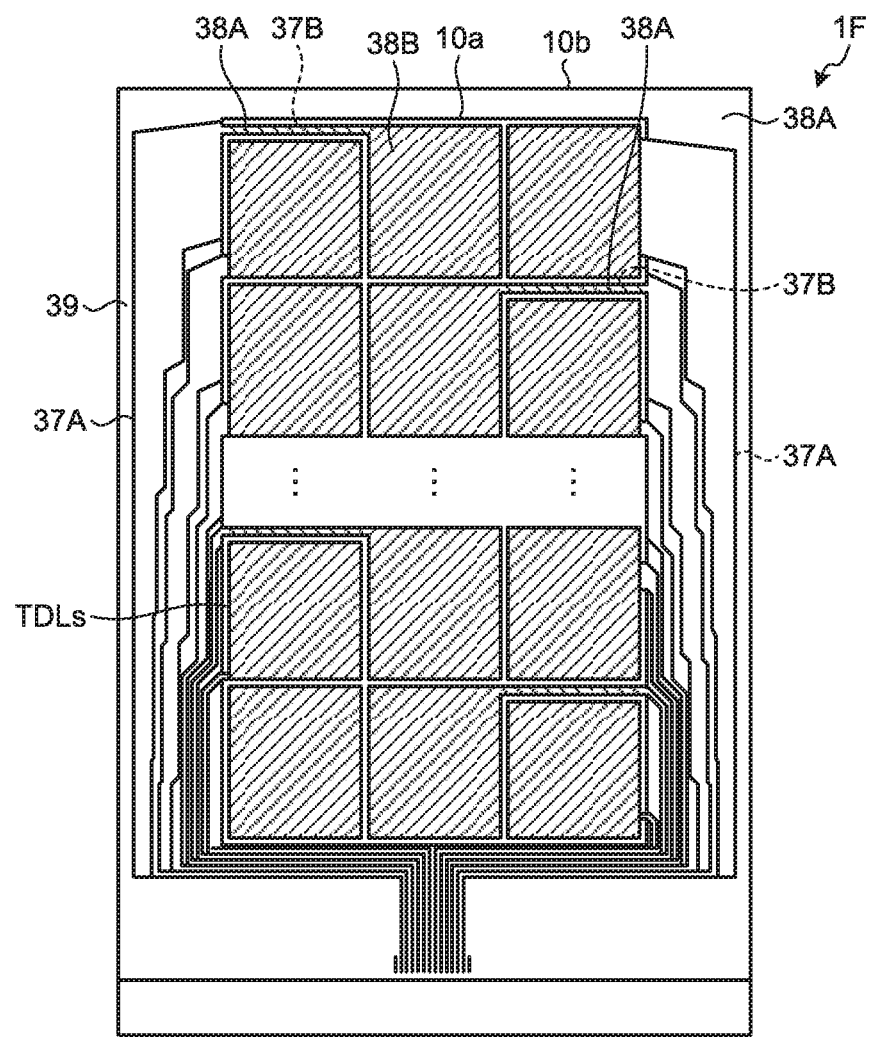
FIG. 29 is a plan view schematically illustrating a second substrate according to a second modification of the second embodiment.

FIG. 29 is a plan view schematically illustrating the second substrate according to a second modification of the second embodiment. A display device 1F according to the present modification is different from the display devices 1D and 1E described above in that the first insulating layer 38A is not arranged at the position superimposed on the frame wiring 37A. Also in the present modification, the second insulating layer 38B is arranged at the position superimposed on the detection electrode TDLs in the display region 10a. Furthermore, the first insulating layer 38A is arranged at the position superimposed on the frame wiring 37A and between the detection electrodes TDLs. Thus, the electric field Eg passes through the second insulating layer 38B arranged on the detection electrode TDLs to extend upward, and good detection sensitivity can be obtained.

In the present modification, the overcoat layer 39 is arranged in the frame region 10b while covering the frame wiring 37A. The overcoat layer 39 may be continuously arranged over the first insulating layer 38A and the second insulating layer 38B in the display region 10a. By arranging the overcoat layer 39, a level difference can be reduced to flatten a portion where the first insulating layer 38A and the second insulating layer 38B are arranged and the frame region 10b in which the first insulating layer 38A is not arranged.

In the present modification, the first relative dielectric constant of the first insulating layer 38A is smaller than the relative dielectric constant of the overcoat layer 39, and the second relative dielectric constant of the second insulating layer 38B is equal to or larger than the relative dielectric constant of the overcoat layer 39.

The touch panel 30 (detection device) according to the present embodiment can be configured as follows. In the touch panel 30 according to the present embodiment, contact or proximity of an external object is detected based on a change in capacitance generated between the detection electrode TDLs (first electrode) and the external object. In the insulating layer 38, the second insulating layer 38B is arranged at the portion superimposed on the detection electrode TDLs, and the first insulating layer 38A is arranged at the portion not superimposed on the detection electrode TDLs.

In the touch panel 30 according to the present embodiment, the second insulating layer 38B and the first insulating layer 38A are laminated at the portion superimposed on the detection electrode TDLs, and the first insulating layer 38A is arranged at the portion not superimposed on the detection electrode TDLs.

A plurality of detection electrodes TDLs are arranged in the display region 10a, and the coupling wiring 37B coupled to the detection electrodes TDLs is arranged between the detection electrodes TDLs. The first insulating layer 38A of the insulating layer 38 is arranged at the portion superimposed on the coupling wiring 37B.

Examples

Figure 30:
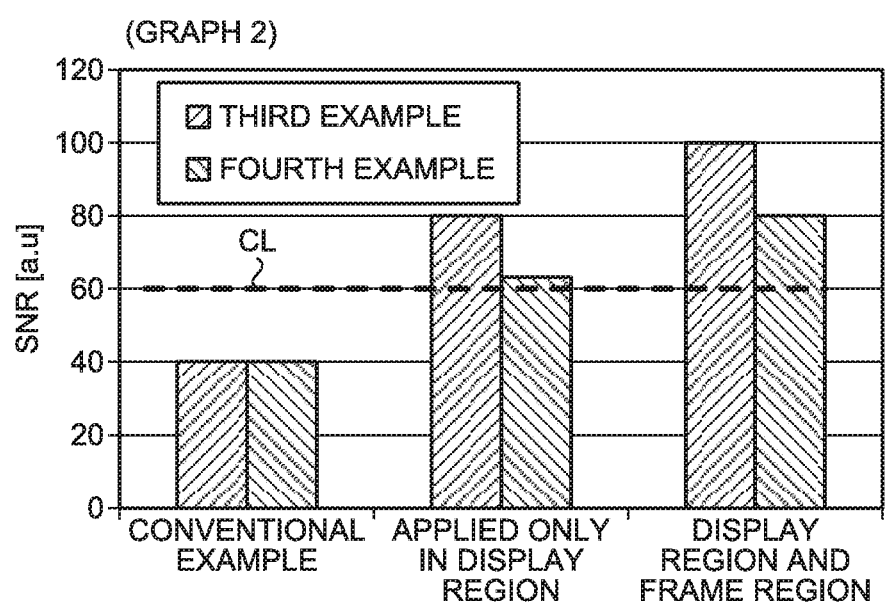
FIG. 30 is a graph representing an SN ratio (SNR) of a display device according to a third example and a fourth example.

FIG. 30 is a graph representing the SN ratio (SNR) of the display device according to a third example and a fourth example. A conventional example illustrated in the graph 2 in FIG. 30 represents a display device obtained by not arranging the first insulating layer 38A and the second insulating layer 38B in the display device 1D illustrated in FIGS. 24 to 26. In the display device according to the conventional example, the overcoat layer having a uniform relative dielectric constant is arranged in the display region and the frame region. The configuration thereof except the insulating layer is similar to that of the display device 1D. The third example is a configuration similar to that of the display device 1D according to the second embodiment illustrated in FIGS. 24 to 26. The fourth example is a configuration in which the first insulating layer 38A and the second insulating layer 38B are laminated at the position superimposed on the detection electrode TDLs similarly to the display device 1E according to the first modification illustrated in FIG. 27. For the third example and the fourth example, the SN ratio is calculated for a case in which the first insulating layer 38A and the second insulating layer 38B are arranged only in the display region 10a (refer to FIG. 29) and a case in which the first insulating layer 38A and the second insulating layer 38B are arranged across both the display region 10a and the frame region 10b (refer to FIG. 25).

As illustrated in FIG. 30, the display device according to the conventional example has the SN ratio lower than the reference value CL. In contrast, each of the display devices according to the third example and the fourth example has the SN ratio higher than the reference value CL. The SN ratio in the third example is higher than that of the display device according to the fourth example. In the display device according to the third example, the second insulating layer 38B is arranged as a single layer at the position superimposed on the detection electrode TDLs (refer to FIG. 26). Accordingly, the relative dielectric constant becomes higher than that in the fourth example in which the first insulating layer 38A and the second insulating layer 38B are laminated (refer to FIG. 28), the electric field intensity of the detection electrode TDLs is increased, and a larger detection signal can be obtained.

When the insulating layer is arranged in both the display region 10a and the frame region 10b, the SN ratio is further improved as compared with a case in which the insulating layer is arranged only in the display region 10a. Accordingly, it is shown that external noise is prevented from entering the frame wiring 37A by arranging the first insulating layer 38A in the frame region 10b.

As described above, it is shown that the display device according to the third example and the fourth example can improve detection performance by arranging the second insulating layer 38B at the position superimposed on the detection electrode TDLs and arranging the first insulating layer 38A at the position not superimposed on the detection electrode TDLs, that is, the position superimposed on the coupling wiring 37B and between the detection electrodes TDLs. Additionally, the display device according to the third example and the fourth example can suppress noise to improve detection performance by arranging the first insulating layer 38A at the position superimposed on the frame wiring 37A.

Third Embodiment

Figure 31:
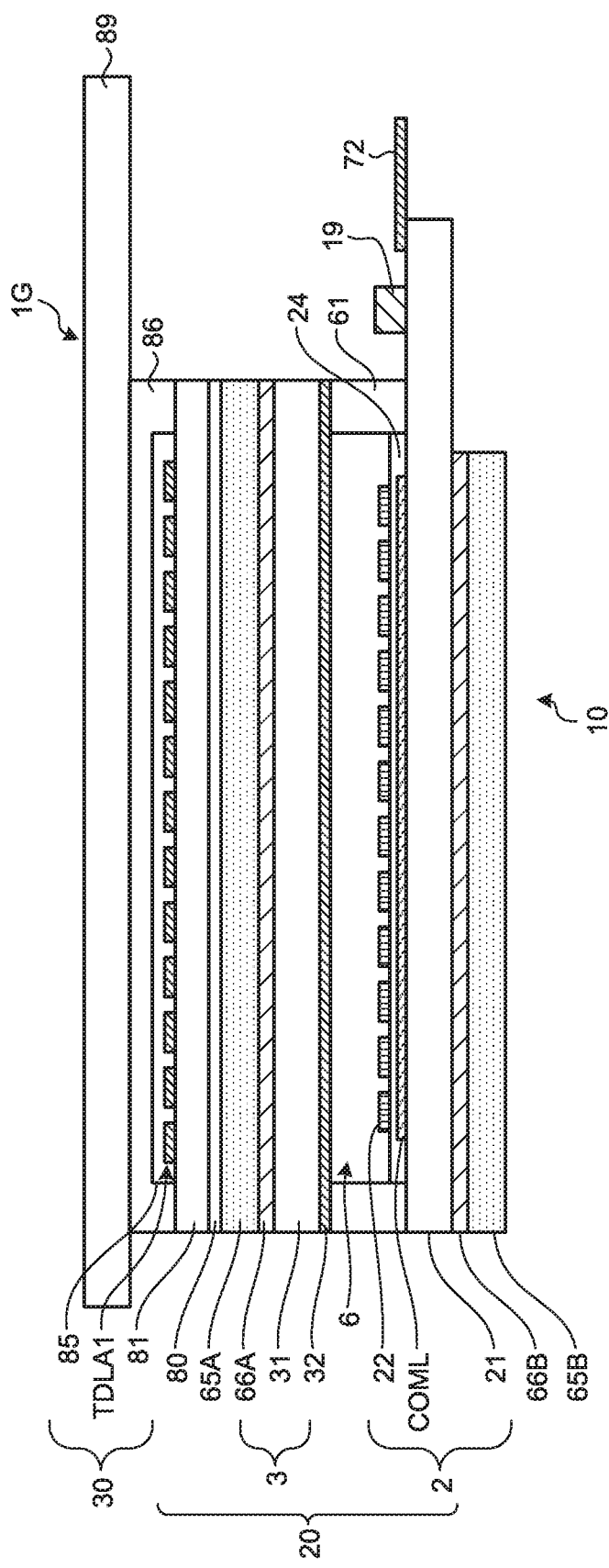
FIG. 31 is a cross-sectional view representing a schematic cross-sectional structure of a display device according to a third embodiment.

FIG. 31 is a cross-sectional view representing a schematic cross-sectional structure of the display device according to a third embodiment. In the display devices 1 to 1F described above, the color filter 32 is arranged on one surface of the second substrate 31 of the counter substrate 3, and the detection electrode layers TDLA and TDLB are arranged on the other surface thereof. A display device 1G according to the present embodiment is different from the display devices 1 to 1F described above in that the touch panel 30 is arranged on the display panel 20. The configuration of the display panel 20 is the same as that of the display device 1.

As illustrated in FIG. 31, in the display device 1G according to the present embodiment, the polarizing plate 65A is arranged above the second substrate 31 via the bonding layer 66A. The touch panel 30 is arranged above the polarizing plate 65A via a bonding layer 80. The touch panel 30 includes a third substrate 81, a detection electrode layer TDLA1 arranged on the third substrate 81, and an insulating layer 85 covering the detection electrode layer TDLA1. A cover glass 89 is bonded above the insulating layer 85 via the bonding layer 86. The third substrate 81 is, for example, a glass substrate, a resin substrate, or a film-like resin substrate. A flexible substrate (not illustrated) and a detection control IC may be arranged on the third substrate 81.

Figure 32:
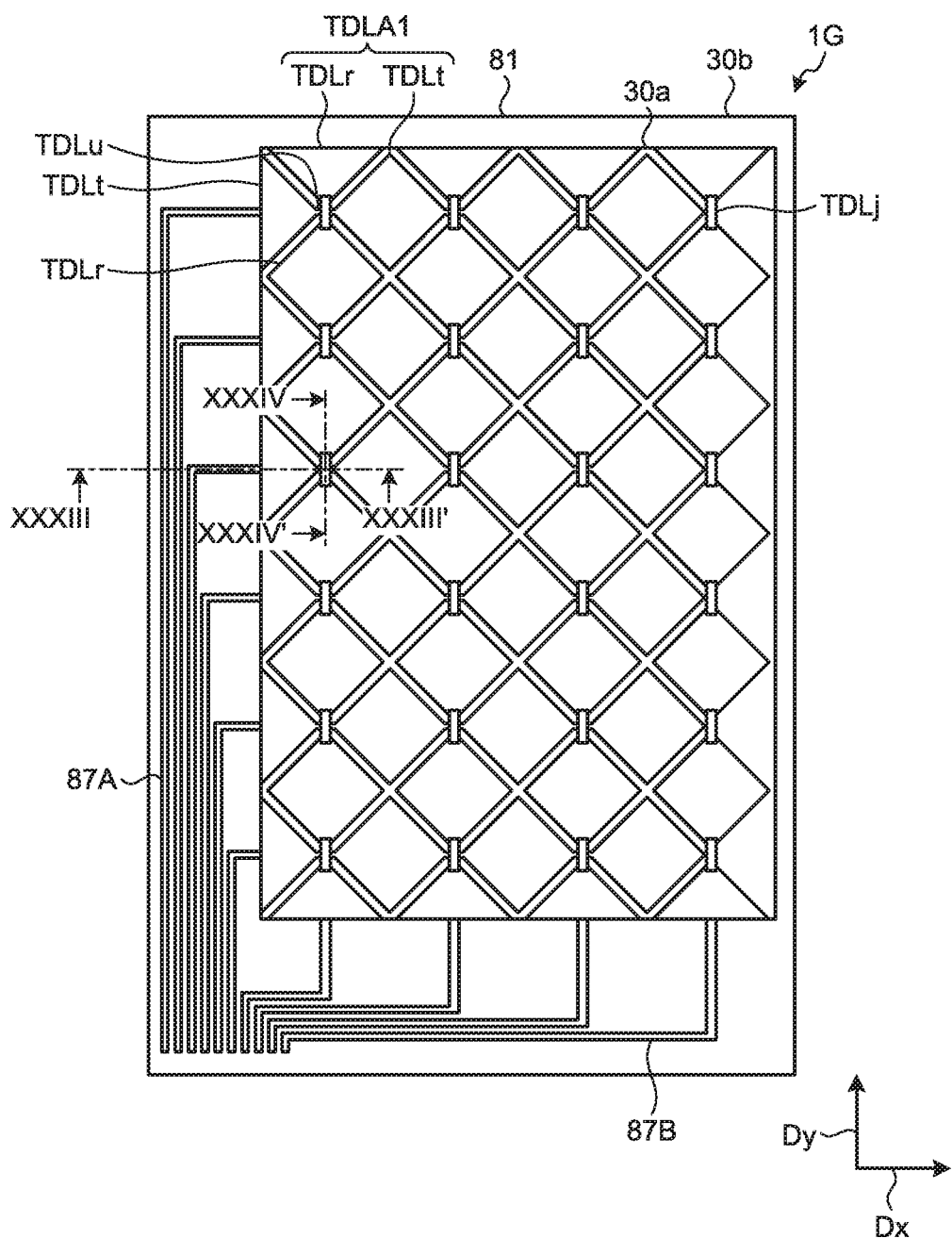
FIG. 32 is a plan view schematically illustrating a third substrate of the display device according to the third embodiment.
Figure 33:
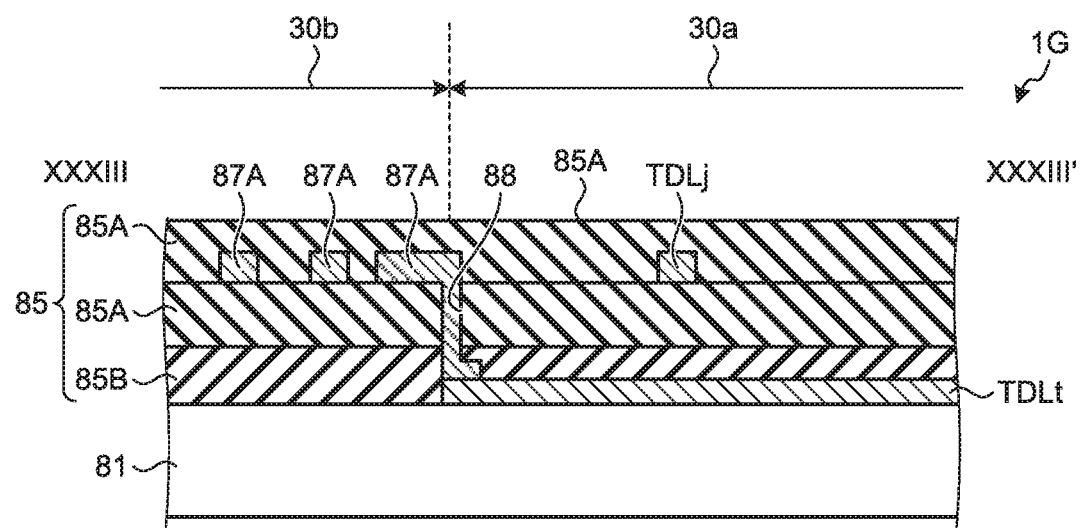
FIG. 33 is a cross-sectional view along the line XXXIII-XXXIII' in FIG. 32.
Figure 34:
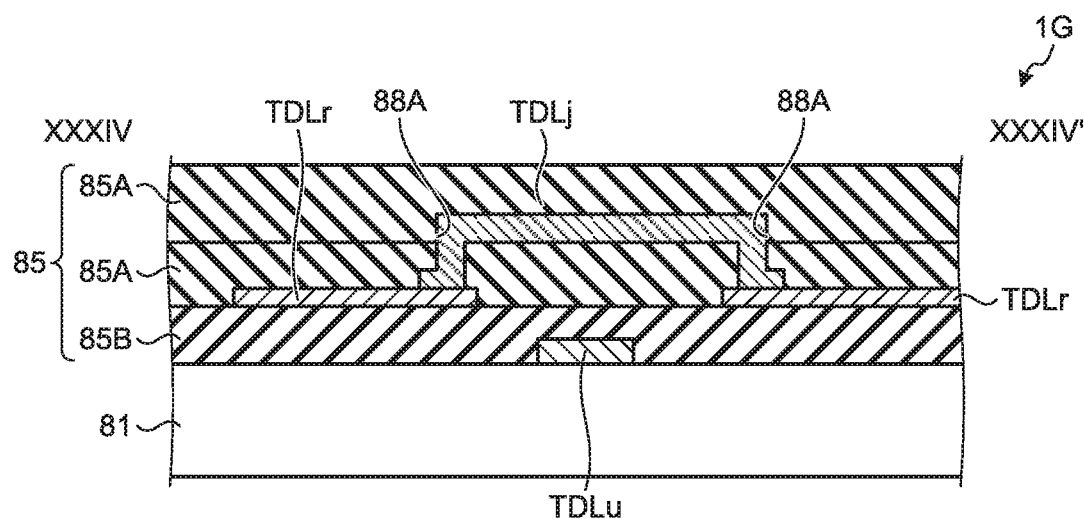
FIG. 34 is a cross-sectional view along the line XXXIV-XXXIV' in FIG. 32.

FIG. 32 is a plan view schematically illustrating the third substrate of the display device according to the third embodiment. FIG. 33 is a cross-sectional view along the line XXXIII-XXXIII' in FIG. 32. FIG. 34 is a cross-sectional view along the line XXXIV-XXXIV' in FIG. 32.

As illustrated in FIG. 32, the third substrate 81 includes a transmission region 30a and a frame region 30b outside the transmission region 30a arranged therein. The transmission region 30a is a translucent region, and transmits a displayed image of the display panel 20 to cause an operator to visually recognize the displayed image. A colored decorative layer (not illustrated) is arranged at a position overlapped with the frame region 30b, and light from the display panel 20 is blocked by the decorative layer. The decorative layer is arranged on the cover glass 89 or between the cover glass 89 and the third substrate 81.

The detection electrode layer TDLA1 is arranged in the transmission region 30a of the third substrate 81. The detection electrode layer TDLA1 includes a drive electrode TDLt and a detection electrode TDLr. A plurality of drive electrodes TDLt are arranged in the first direction Dx. The drive electrodes TDLt adjacent to each other in the first direction Dx are coupled to each other via a narrow coupling part TDLu. A plurality of drive electrodes TDLt coupled to each other via the coupling part TDLu are arranged along the first direction Dx as a whole, and arranged in the second direction Dy. Frame wiring 87A is coupled to each end of the drive electrodes TDLt coupled to each other via the coupling part TDLu.

A plurality of detection electrodes TDLr are arranged in the second direction Dy. The detection electrodes TDLr adjacent to each other in the second direction Dy are coupled to each other via a narrow jumper TDLj. The detection electrode TDLr is arranged with an interval from the drive electrode TDLt in a plan view. The jumper TDLj is arranged to intersect with the coupling part TDLu. The detection electrodes TDLr coupled to each other via the jumper TDLj are arranged along the second direction Dy as a whole, and are arranged in the first direction Dx. Frame wiring 87B is coupled to the detection electrodes TDLr coupled to each other via the jumper TDLj.

With such a configuration, capacitance is generated between the drive electrode TDLt and the detection electrode TDLr adjacent to each other. A drive signal is supplied to the drive electrode TDLt via the frame wiring 87A. A detection signal is output from the detection electrode TDLr via the frame wiring 87B based on a change in the capacitance between the drive electrode TDLt and the detection electrode TDLr. In this way, contact or proximity of the external object can be detected. The drive electrode TDLt corresponds to the drive electrode E1 in the basic principle of mutual capacitance touch detection described above, and the detection electrode TDLr corresponds to the detection electrode E2.

As the drive electrode TDLt, the detection electrode TDLr, and the coupling part TDLu, for example, a translucent conductive material such as ITO is used. As the jumper TDLj and pieces of frame wiring 87A and 87B, a metallic material having good electrical conductivity can be used. As the metallic material, for example, at least one of aluminum (Al), copper (Cu), silver (Ag), molybdenum (Mo), and alloy thereof can be used. As the jumper TDLj, a translucent conductive material that is the same as the detection electrode TDLr or the like can be used.

As illustrated in FIG. 32, the drive electrode TDLt and the detection electrode TDLr have a diamond shape. The embodiment is not limited thereto. The drive electrode TDLt and the detection electrode TDLr may have another shape such as a polygon.

As illustrated in FIGS. 33 and 34, the insulating layer 85 is arranged while covering the drive electrode TDLt and the detection electrode TDLr. Similarly to the first embodiment and the second embodiment described above, the insulating layer 85 includes a first insulating layer 85A and a second insulating layer 85B. The first insulating layer 85A has the first relative dielectric constant, and the second insulating layer 85B has the second relative dielectric constant larger than the first relative dielectric constant. For example, the first relative dielectric constant is smaller than 3.5, and the second relative dielectric constant is equal to or larger than 3.5.

In the present embodiment, the drive electrode TDLt and the detection electrode TDLr are arranged in different layers. As illustrated in FIG. 33, the drive electrode TDLt is arranged on the third substrate 81. As illustrated in FIG. 34, the coupling part TDLu that couples the drive electrodes TDLt to each other is arranged in the same layer as the drive electrode TDLt, that is, on the third substrate 81. As illustrated in FIGS. 33 and 34, the second insulating layer 85B is arranged while covering the drive electrode TDLt and the coupling part TDLu.

As illustrated in FIG. 34, the detection electrode TDLr is arranged on the second insulating layer 85B. The first insulating layer 85A is arranged while covering the detection electrode TDLr. In the present embodiment, two first insulating layers 85A are arranged. The first insulating layer 85A as the second layer is arranged on the first insulating layer 85A as the first layer arranged on the detection electrode TDLr. As illustrated in FIGS. 33 and 34, the frame wiring 87A and the jumper TDLj are arranged on the first insulating layer 85A as the first layer. The frame wiring 87A is coupled to the drive electrode TDLt via a through hole 88. The jumper TDLj couples the detection electrodes TDLr to each other via the through hole 88A. The first insulating layer 85A as the second layer is arranged while covering the frame wiring 87A and the jumper TDLj. Although not illustrated in FIGS. 33 and 34, the frame wiring 87B coupled to the detection electrode TDLr is also arranged in the same layer as the frame wiring 87A, that is, on the first insulating layer 85A as the first layer, and the first insulating layer 85A as the second layer is arranged while covering the frame wiring 87B.

As illustrated in FIGS. 33 and 34, the second insulating layer 85B and the first insulating layer 85A are arranged at a position superimposed on the drive electrode TDLt and the coupling part TDLu and above the drive electrode TDLt and the coupling part TDLu. As illustrated in FIG. 34, the first insulating layer 85A is arranged at a position overlapped with the detection electrode TDLr and the jumper TDLj and above the detection electrode TDLr and the jumper TDLj. Thus, the second insulating layer 85B having a relative dielectric constant which is relatively high is arranged above the drive electrode TDLt, so that the relative dielectric constant above the drive electrode TDLt is larger than the relative dielectric constant above the detection electrode TDLr.

With such a configuration, as compared with a case in which the insulating layers 85 (the first insulating layer 85A and the second insulating layer 85B) are uniformly arranged above the detection electrode TDLr and the drive electrode TDLt, an electric line of force of an electric field passing through the second insulating layer 85B reaches a farther position upward from the detection electrode TDLr, and a reachable range of the electric line of force is enlarged. Thus, the display device 1G according to the present embodiment improves detection sensitivity.

On the other hand, only the first insulating layer 85A having a relative dielectric constant which is relatively small is arranged above the detection electrode TDLr. Thus, external noise can be prevented from entering the detection electrode TDLr. The first insulating layer 85A and the second insulating layer 85B are continuously arranged over the transmission region 30a and the frame region 30b. The first insulating layer 85A having a relative dielectric constant which is relatively low is arranged above the frame wiring 87A and the frame wiring 87B (refer to FIG. 32). Accordingly, the number of electric lines of force of the electric field passing through the first insulating layer 85A is reduced. Thus, even when the external object is brought into contact with or proximate to the frame wiring 87A and the frame wiring 87B, capacitance generated between the external object and the frame wiring 87A is suppressed, and capacitance generated between the external object and the frame wiring 87B is suppressed. Accordingly, the frame wiring 87A and the frame wiring 87B are prevented from functioning as the detection electrode, and detection performance can be improved.

The first insulating layer 85A is arranged, so that external noise can be prevented from entering the frame wiring 87A and the frame wiring 87B. Thus, the SN ratio can be improved.

The jumper TDLj is arranged in the same layer as the frame wiring 87A and the frame wiring 87B. Thus, the jumper TDLj can be formed in the same process as that of the frame wiring 87A and the frame wiring 87B, and production cost can be reduced. In the present embodiment, the detection electrode TDLr and the drive electrode TDLt are arranged in different layers, so that the jumper TDLj may be arranged in the same layer as the detection electrode TDLr. In this case, by using the same material as that of the detection electrode TDLr for the jumper TDLj, the jumper TDLj and the detection electrode TDLr can be formed at the same time.

First Modification of Third Embodiment

Figure 35:
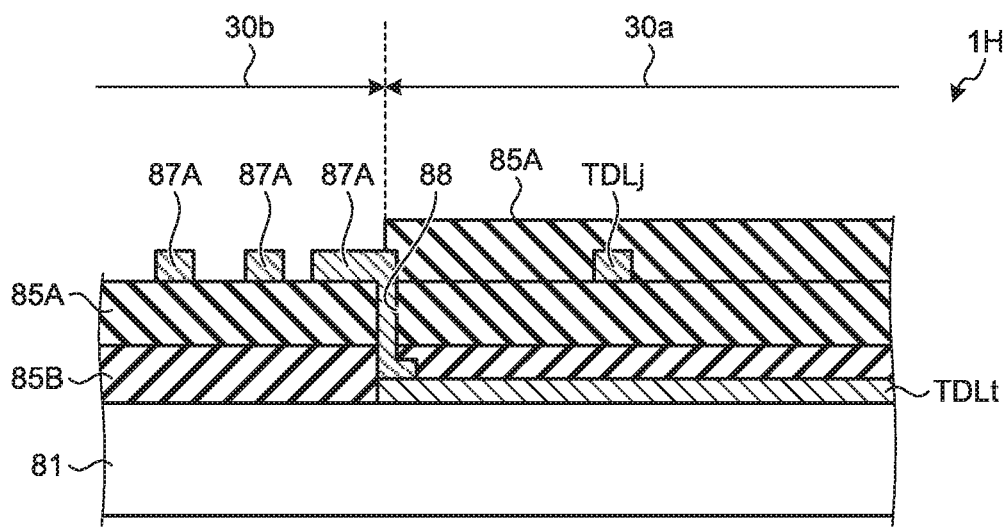
FIG. 35 is a cross-sectional view of a display device according to a first modification of the third embodiment.

FIG. 35 is a cross-sectional view of the display device according to a first modification of the third embodiment. FIG. 35 is a cross-sectional view cut at a position corresponding to the line XXXIII-XXXIII' in FIG. 32. In a display device 1H according to the present modification, the configuration of the detection electrode TDLr, the drive electrode TDLt, the first insulating layer 85A, and the second insulating layer 85B in the transmission region 30a is the same as the configuration illustrated in FIG. 33 and FIG. 34. The display device 1H according to the present modification is different from the display devices described above in that the first insulating layer 85A is not arranged above the frame wiring 87A in the frame region 30b. The first insulating layer 85A is also not arranged above the frame wiring 87B that is not illustrated in FIG. 35.

Even in such an aspect, the relative dielectric constant above the drive electrode TDLt is larger than the relative dielectric constant above the detection electrode TDLr at least in the transmission region 30a. Thus, the display device 1H according to the present modification can improve detection sensitivity. In this case, an overcoat layer may be arranged above the frame wiring 87A and the frame wiring 87B. By continuously arranging the overcoat layer over the frame region 30b and the first insulating layer 85A in the transmission region 30a, a level difference can be reduced to flat.

In the present modification, in the frame region 30b, the second insulating layer 85B, the first insulating layer 85A, and the frame wiring 87A are laminated on the third substrate 81 in this order. However, the embodiment is not limited thereto. There may be a case in which any one of or both the first insulating layer 85A and the second insulating layer 85B are not arranged in the frame region 30b.

Second Modification of Third Embodiment

Figure 36:
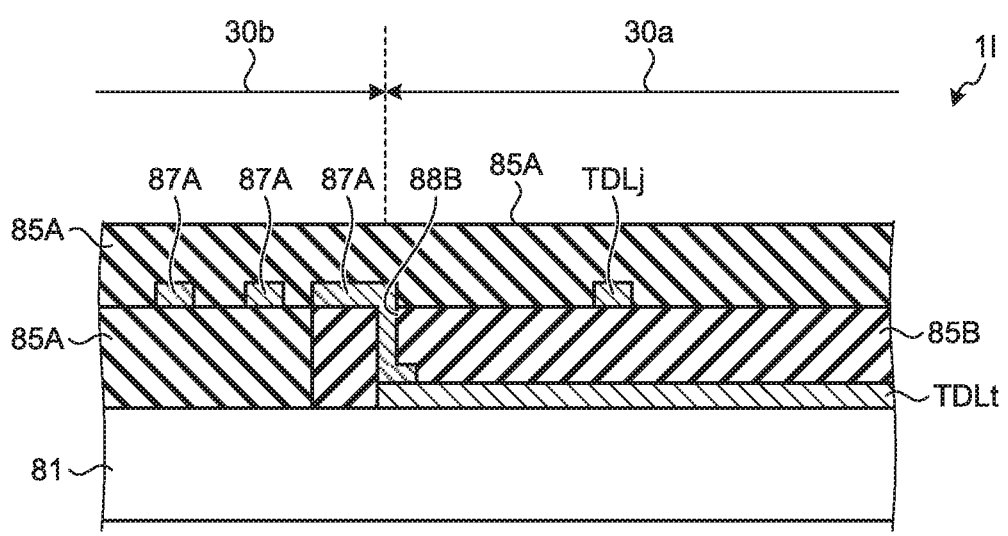
FIG. 36 is a cross-sectional view of a display device according to a second modification of the third embodiment.
Figure 37:
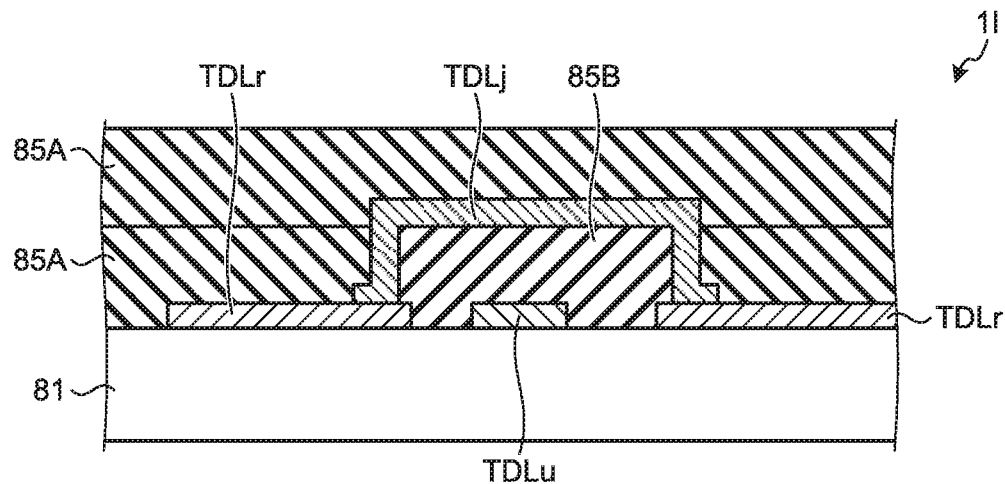
FIG. 37 is a cross-sectional view of the display device according to the second modification of the third embodiment being cut in a direction different from that in FIG. 36.

FIG. 36 is a cross-sectional view of the display device according to a second modification of the third embodiment. FIG. 37 is a cross-sectional view of the display device according to the second modification of the third embodiment being cut in a direction different from that in FIG. 36. FIG. 36 is a cross-sectional view cut at a position corresponding to the line XXXIII-XXXIII' in FIG. 32. FIG. 37 is a cross-sectional view cut at a position corresponding to the line XXXIV-XXXIV' in FIG. 32.

As illustrated in FIGS. 36 and 37, in a display device 1I according to the present modification, the detection electrode TDLr and the drive electrode TDLt are arranged in the same layer on the third substrate 81. The coupling part TDLu is also arranged on the third substrate 81. The second insulating layer 85B is arranged at a position superimposed on the drive electrode TDLt and the coupling part TDLu. As illustrated in FIG. 37, the jumper TDLj is arranged on the second insulating layer 85B that is arranged at a position superimposed on the coupling part TDLu, and couples the detection electrodes TDLr to each other.

The first insulating layer 85A as the first layer is arranged at a position not superimposed on the drive electrode TDLt and the coupling part TDLu. That is, as illustrated in FIG. 36, the first insulating layer 85A is arranged on the third substrate 81 in the frame region 30b. The frame wiring 87A is coupled to the drive electrode TDLt via a through hole 88B arranged in the second insulating layer 85B, and arranged on the first insulating layer 85A as the first layer. The frame wiring 87B (refer to FIG. 32) that is not illustrated in FIGS. 36 and 37 is also arranged on the first insulating layer 85A as the first layer. As illustrated in FIG. 37, the first insulating layer 85A as the first layer is arranged on the detection electrode TDLr.

As illustrated in FIGS. 36 and 37, the first insulating layer 85A as the second layer is arranged while covering the frame wiring 87A and the jumper TDLj. The first insulating layer 85A as the second layer is arranged above the second insulating layer 85B and the first insulating layer 85A as the first layer.

As illustrated in FIGS. 36 and 37, the second insulating layer 85B and the first insulating layer 85A are laminated on a position overlapped with the drive electrode TDLt and the coupling part TDLu in this order. The first insulating layer 85A is arranged at a position overlapped with the detection electrode TDLr and the jumper TDLj. Thus, also in the display device 1I according to the present modification, the second insulating layer 85B having a relative dielectric constant which is relatively high is arranged above the drive electrode TDLt, so that the relative dielectric constant above the drive electrode TDLt is larger than the relative dielectric constant above the detection electrode TDLr.

In the display device 1I according to the present embodiment, an electric line of force of an electric field passing through the second insulating layer 38B reaches a farther position upward from the detection electrode TDLr. A reachable range of the electric line of force is enlarged, so that detection sensitivity is improved.

The first insulating layer 85A having a relative dielectric constant which is relatively small is arranged above the detection electrode TDLr and the frame wiring 87A, so that entry of external noise can be prevented to improve detection performance.

Third Modification of Third Embodiment

Figure 38:
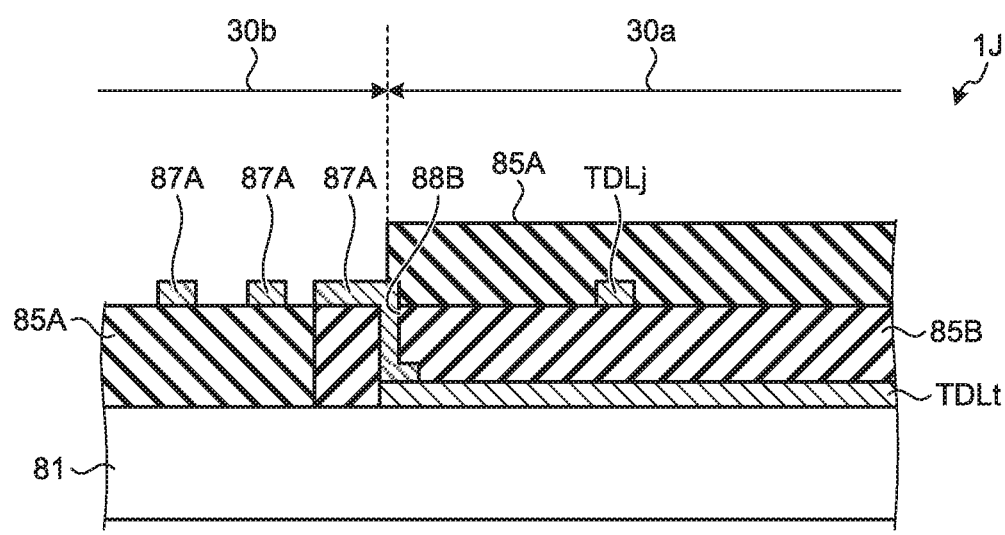
FIG. 38 is a cross-sectional view of the display device according to a third modification of the third embodiment.

FIG. 38 is a cross-sectional view of the display device according to a third modification of the third embodiment. In a display device 1J according to the present modification, the configuration of the detection electrode TDLr, the drive electrode TDLt, the first insulating layer 85A, and the second insulating layer 85B in the transmission region 30a is the same as that in the display device 1I illustrated in FIGS. 36 and 37. The display device 1J according to the present modification is different from the display device 1I in that the first insulating layer 85A is not arranged above the frame wiring 87A in the frame region 30b. The first insulating layer 85A is also not arranged above the frame wiring 87B that is not illustrated in FIG. 38.

Even in such an aspect, the relative dielectric constant at a position overlapped with the drive electrode TDLt is larger than the relative dielectric constant at a position overlapped with the detection electrode TDLr at least in the transmission region 30a. Thus, the display device 1J according to the present modification can improve detection sensitivity. In this case, an overcoat layer may be arranged above the frame wiring 87A and the frame wiring 87B. By continuously arranging the overcoat layer over the frame region 30b and the first insulating layer 85A in the transmission region 30a, a level difference can be reduced to flat.

In the present modification, in the frame region 30b, the second insulating layer 85B and the first insulating layer are arranged above the third substrate 81. However, the embodiment is not limited thereto. There may be a case in which any one of or both the first insulating layer 85A and the second insulating layer 85B are not arranged in the frame region 30b.

EXAMPLES

Figure 39:
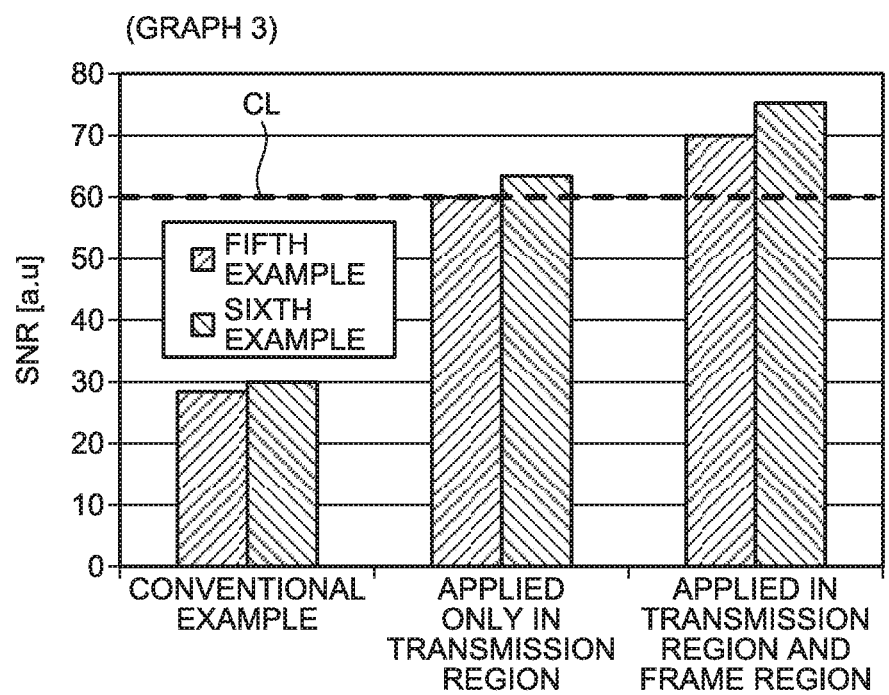
FIG. 39 is a graph representing an SN ratio (SNR) of a display device according to a fifth example and a sixth example.

FIG. 39 is a graph representing the SN ratio (SNR) of the display device according to a fifth example and a sixth example. A conventional example illustrated in the graph 3 in FIG. 39 represents a display device obtained by not arranging the first insulating layer 85A and the second insulating layer 85B in the display device 1G according to the third embodiment and the display device 1I according to the second modification, but arranging an overcoat layer having a uniform relative dielectric constant at a position superimposed on the detection electrode TDLr and the drive electrode TDLt. The configuration thereof except the insulating layer is the same as that of the display device 1G illustrated in FIGS. 31 to 34 and the display device 1I illustrated in FIGS. 36 and 37.

The fifth example represents a configuration in which the detection electrode TDLr and the drive electrode TDLt are arranged in different layers similarly to the display device 1G according to the third embodiment and the display device 1H according to the first modification illustrated in FIGS. 31 to 35. The sixth example represents a configuration in which the detection electrode TDLr and the drive electrode TDLt are arranged in the same layer similarly to the display device 1I according to the second modification illustrated in FIGS. 36 and 37 and the display device 1J according to the third modification illustrated in FIG. 37. For the fifth example and the sixth example, the SN ratio is calculated for a case in which the first insulating layer 85A and the second insulating layer 85B are arranged only in the transmission region 30a and a case in which the first insulating layer 85A and the second insulating layer 85B are arranged across both the transmission region 30a and the frame region 30b.

As illustrated in FIG. 39, the display device according to the conventional example has the SN ratio lower than the reference value CL. In contrast, each of the display devices according to the fifth example and the sixth example has the SN ratio higher than the reference value CL. As illustrated in the graph 3, the sixth example represents a relatively high SN ratio, the sixth example having a configuration in which the detection electrode TDLr and the drive electrode TDLt are arranged in the same layer. In the display device according to the sixth example, the second insulating layer 85B is arranged only at a position superimposed on the drive electrode TDLt. Thus, a difference in the relative dielectric constant is increased between the position superimposed on the drive electrode TDLt and the position not superimposed on the drive electrode TDLt, density of the electric line of force extending upward from the drive electrode TDLt is increased, and detection sensitivity is improved.

When the insulating layer is arranged in both the transmission region 30a and the frame region 30b, the SN ratio is further improved as compared with a case in which the insulating layer is arranged only in the transmission region 30a. Accordingly, it is shown that external noise is prevented from entering the pieces of frame wiring 87A and 87B by arranging the first insulating layer 38A in the frame region 30b.

As described above, it is shown that the display device according to the fifth example and the sixth example can improve detection performance by arranging the first insulating layer 85A at the position superimposed on the detection electrode TDLr and arranging the second insulating layer 85B at the position not superimposed on the detection electrode TDLr, that is, the position superimposed on the drive electrode TDLt. Additionally, the display device according to the fifth example and the sixth example can suppress noise to improve detection performance by arranging the first insulating layer 85A at the position superimposed on the frame wiring 87A and the frame wiring 87B.

Fourth Embodiment

Figure 40:
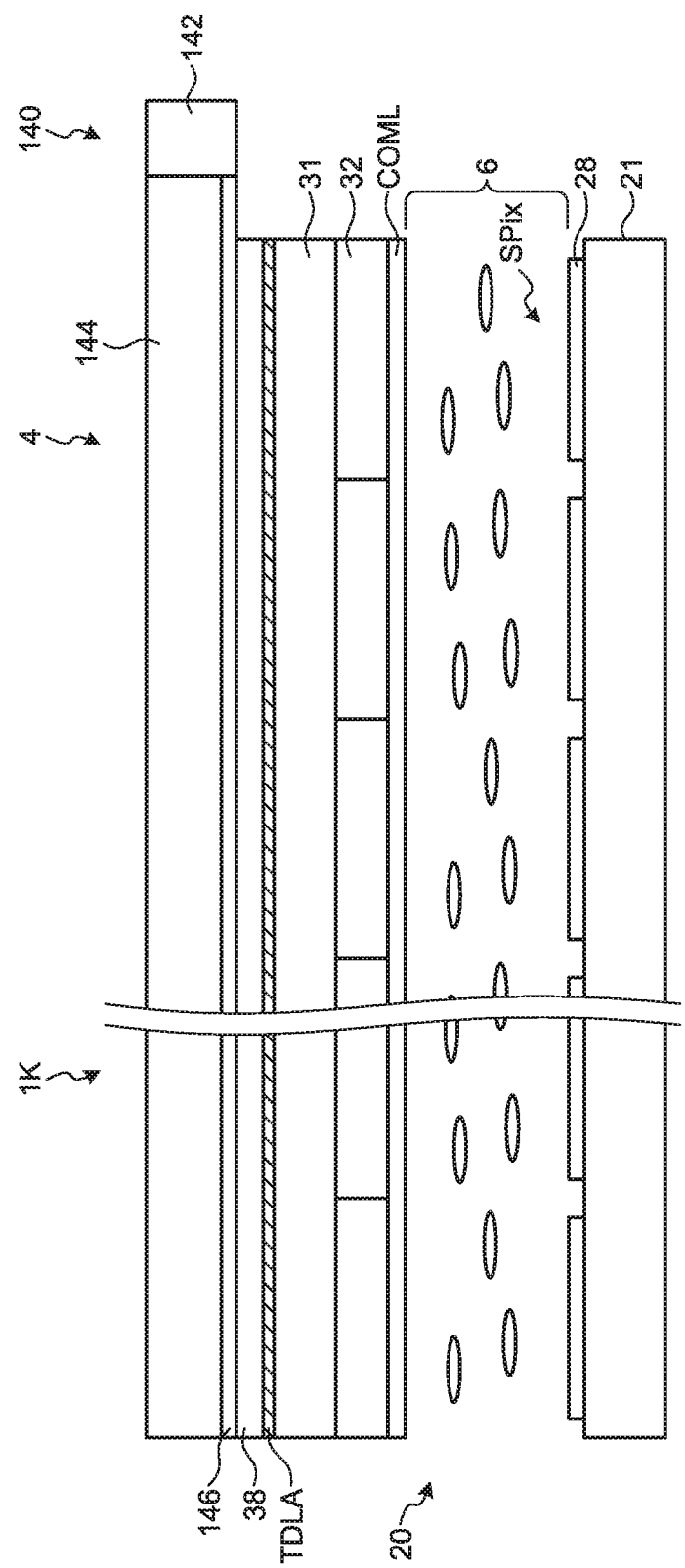
FIG. 40 is a cross-sectional view representing a schematic cross-sectional structure of a display device according to a fourth embodiment.

FIG. 40 is a cross-sectional view representing a schematic cross-sectional structure of the display device according to a fourth embodiment. Each of the display devices 1 and 1A to 1J described above is a transmissive display device that displays an image by transmitting light from the backlight. Alternatively, a reflective display device may be used.

A display device 1K illustrated in FIG. 40 is a reflective display device. As illustrated in FIG. 40, the display device 1K includes the first substrate 21, the second substrate 31, a reflective electrode 28, the liquid crystal layer 6, and a front light unit 4.

The reflective electrode 28 is arranged on a surface of the first substrate 21 opposed to the second substrate 31. The color filter 32 and the drive electrode COML are arranged on a surface of the second substrate 31 opposed to the first substrate 21. The drive electrode COML is electrically coupled to the first substrate 21 via a coupling part (not illustrated), and the drive signal Vcom is supplied thereto. The display device 1K is a display device for color display in which the color filter 32 is arranged. Alternatively, the display device 1K may be a display device for monochrome display in which the color filter 32 is not arranged. The detection electrode layer TDLA and the insulating layer 38 are arranged on a surface of the second substrate 31 opposite to the surface on which the color filter 32 is arranged. The front light unit 4 is arranged above the insulating layer 38 via a bonding layer 146. An optical functional layer such as the polarizing plate 65A (refer to FIG. 5) may be arranged between the insulating layer 38 and the front light unit 4.

The reflective electrode 28 is arranged to correspond to one sub-pixel SPix, reflects external light incident from the second substrate 31 side, and performs display with the reflected light. The second substrate 31 functions as a display surface of the display panel 20. As the reflective electrode 28, for example, a metallic material such as aluminum (Al) is used.

The front light unit 4 is arranged on a surface of the display panel 20 of the display device 1K on which an image is displayed, that is, a surface opposite to the surface of the second substrate 31 on which the color filter 32 is arranged. The front light unit 4 includes a light source 140 and a light guide plate 144. As the light source 140, a light emitting diode (LED) 142 is used. Other light sources such as a fluorescent tube may be used as the light source 140. The light guide plate 144 is a transparent plate-shaped member, and laminated on the second substrate 31 via the bonding layer 146. The light guide plate 144 can reflect and scatter incident light from the light source 140 to be emitted toward the second substrate 31.

The light emitted toward the second substrate 31 passes through the drive electrode COML and the liquid crystal layer 6, is reflected by the reflective electrode 28, and passes through the light guide plate 144 to reach eyes of an observer. As described above, a blocked portion and a transmitted portion of the light emitted toward the second substrate 31 are switched based on a state of liquid crystals at a position where the light passes through. Accordingly, an image is displayed on the display surface.

The detection electrode layer TDLA and the insulating layer 38 have the same configuration as that in the first embodiment described above, and can detect contact or proximity of an external object based on a change in capacitance generated between the drive electrode COML and the detection electrode TDL (refer to FIG. 7). The insulating layer 38 includes the first insulating layer 38A having the first relative dielectric constant and the second insulating layer 38B having the second relative dielectric constant larger than the first relative dielectric constant. Even for the reflective display device 1K, employed is a configuration in which the relative dielectric constant of the insulating layer 38 is changed between the position superimposed on the detection electrode TDL and the position not superimposed on the detection electrode TDL. Accordingly, the electric line of force of the electric field Eg passing through the second insulating layer 38B reaches a farther position upward from the detection electrode TDL. Since the reachable range of the electric line of force is enlarged, detection performance of the display device 1K can be improved. The display device 1K according to the present embodiment does not necessarily include the front light unit 4.

Modification of Fourth Embodiment

Figure 41:
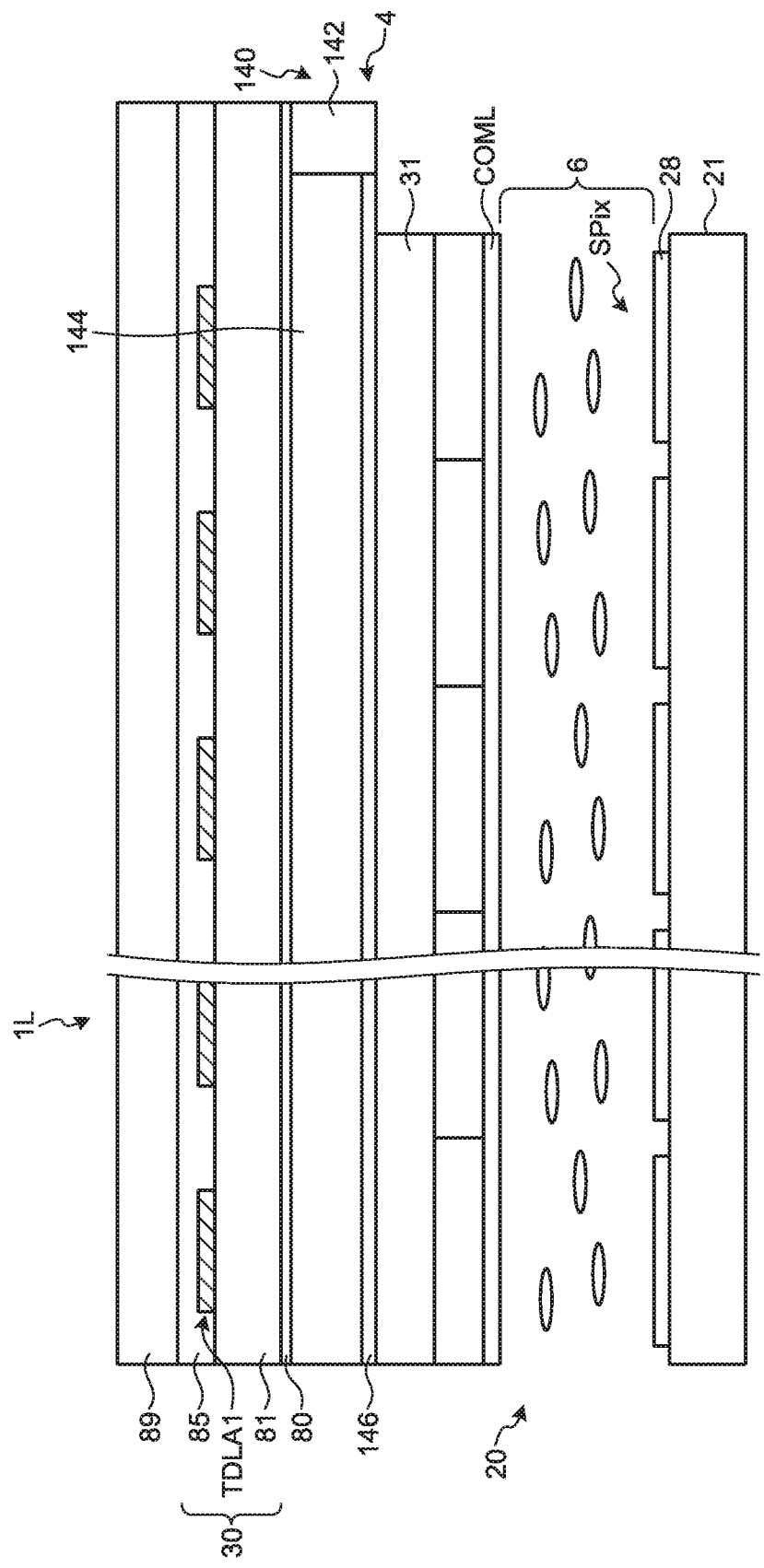
FIG. 41 is a cross-sectional view representing a schematic cross-sectional structure of a display device according to a modification of the fourth embodiment.

FIG. 41 is a cross-sectional view representing a schematic cross-sectional structure of the display device according to a modification of the fourth embodiment. A display device 1L according to the present embodiment is a reflective display device, and the configuration of the display panel 20 is the same as that in FIG. 40. In the display device 1L, the detection electrode layer TDLA is not arranged on the second substrate 31, and the touch panel 30 is arranged on the front light unit 4.

The touch panel 30 includes the third substrate 81, the detection electrode layer TDLA1, and the insulating layer 85 illustrated in the third embodiment, for example. The third substrate 81 is bonded to the front light unit 4 via the bonding layer 80. As described above, in the detection electrode layer TDLA1, the detection electrode TDLr and the drive electrode TDLt are arranged in the same layer or different layers. By causing the relative dielectric constant of the insulating layer 85 to be different between the position superimposed on the detection electrode TDLr and the position superimposed on the drive electrode TDLt, detection performance of the touch panel 30 can be improved. In the display device 1L according to the present embodiment, the touch panel 30 may be arranged on the second substrate 31 without arranging the front light unit 4.

Fifth Embodiment

Figure 42:
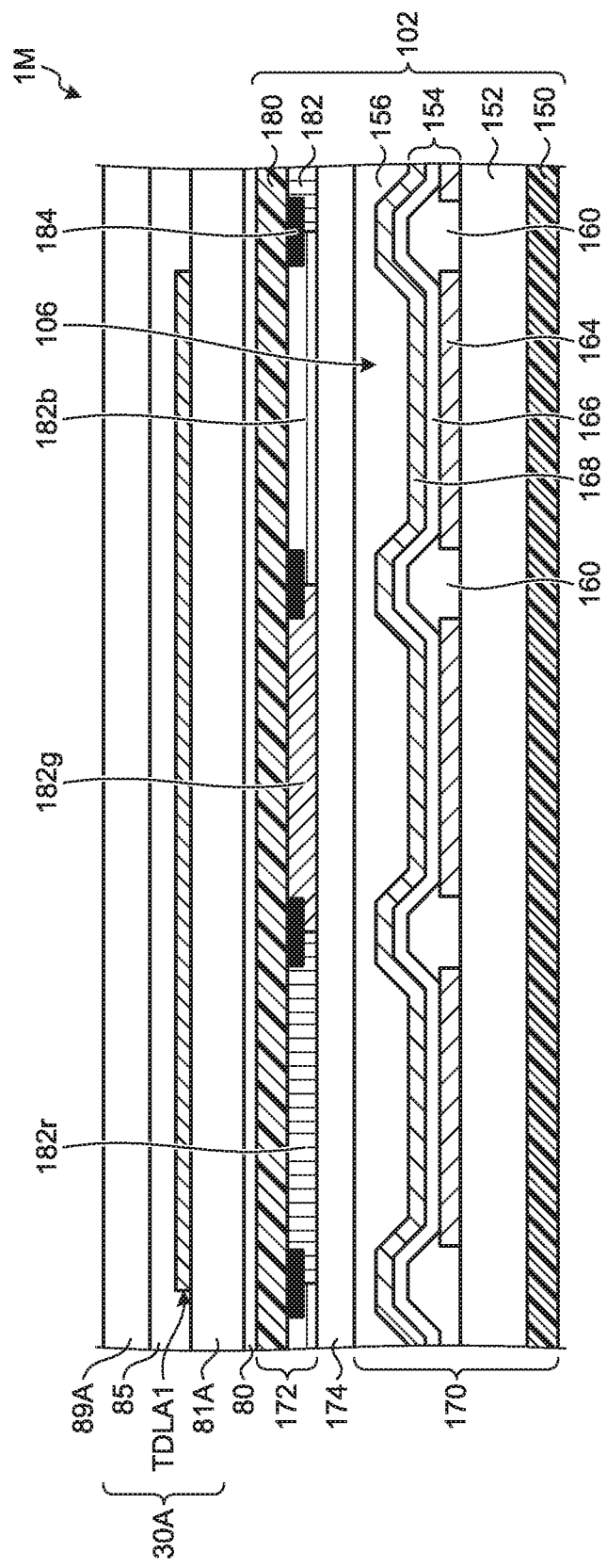
FIG. 42 is a cross-sectional view representing a schematic cross-sectional structure of a display device according to a fifth embodiment.

FIG. 42 is a cross-sectional view representing a schematic cross-sectional structure of the display device according to a fifth embodiment. A display device 1M according to the present embodiment includes an organic EL display panel 102 and a touch panel 30A bonded to the organic EL display panel 102 via the bonding layer 80.

The organic EL display panel 102 includes an organic light-emitting diode (OLED) substrate 170 and a counter substrate 172. The OLED substrate 170 is bonded to the counter substrate 172 via a filler 174.

The OLED substrate 170 includes a plurality of light emitting units (OLED) 106. The organic EL display panel 102 is a top-emission type, and light generated in the light emitting unit 106 is emitted from the counter substrate 172. The counter substrate 172 includes a color filter 182, the light emitting unit 106 generates white light, and the white light is transmitted through the color filter 182 to perform colorization. The organic EL display panel 102 may be configured without the color filter 182 such that the light emitting unit 106 emits light of respective colors of RGB.

The OLED substrate 170 includes a first base material 150 made of a resin film, and a circuitry 152, an OLED unit 154, and a sealing layer 156 laminated on the first base material 150. As the first base material 150, for example, a polyimide film can be used.

The circuitry 152 includes a switching element for performing display driving, and various signal lines. The OLED unit 154 includes the light emitting unit 106 arranged for each pixel, and a bank 160 arranged at a boundary of the pixel. The light emitting unit 106 includes a lower electrode 164, an organic layer 166, and an upper electrode 168 that are laminated in this order. The organic layer 166 includes a positive hole transporting layer, a light emitting layer, an electron transport layer, and the like.

The lower electrode 164 and the upper electrode 168 configures a positive pole and a negative pole of the light emitting unit 106, respectively, and an electric signal applied therebetween controls light emission of the light emitting layer. The upper electrode 168 is arranged across the entire display region, and supplies a common voltage to a plurality of pixels. The lower electrode 164 is arranged for each pixel, and a current corresponding to a video signal is supplied thereto.

The bank 160 is an insulating layer arranged between the pixels, and electrically separates lower electrodes 164 from each other. The sealing layer 156 is arranged on the OLED unit 154, and has a function of preventing transmission of moisture and the like included in the filler 174 and protecting the OLED unit 154.

The counter substrate 172 includes a second base material 180 made of a resin film, and the color filter 182. As the second base material 180, for example, a polyimide film can be used. The color filter 182 includes a color filter 182r corresponding to a red (R) pixel, a color filter 182g corresponding to a green (G) pixel, and a color filter 182b corresponding to a blue (B) pixel. A black matrix 184 is arranged at a boundary between the color filters 182r, 182g, and 182b.

By arranging the touch panel 30A on the organic EL display panel 102 configured as described above, the display device 1M having a touch detection function is configured. The organic EL display panel 102 is a flexible display device. In the touch panel 30A, a flexible resin film is used as a third base material 81A. A cover film 89A made of a resin film is arranged on the touch panel 30A.

In the touch panel 30A, the detection electrode layer TDLA1 and the insulating layer 85 are arranged on the third base material 81A. The detection electrode layer TDLA1 and the insulating layer 85 each have the same configuration as those in the third embodiment described above. That is, in the detection electrode layer TDLA1, the detection electrode TDLr and the drive electrode TDLt are arranged in the same layer or different layers. By causing the relative dielectric constant of the insulating layer 85 to be different between the position superimposed on the detection electrode TDLr and the position superimposed on the drive electrode TDLt, detection performance of the touch panel 30A can be improved. The touch panel 30A is not limited thereto. The touch panel 30A may be a touch panel for performing self-capacitance touch detection in which a plurality of detection electrodes TDLs are arranged in a matrix as described in the second embodiment.

The preferred embodiments of the present invention have been described above. However, the present invention is not limited thereto. Content disclosed in the embodiments is merely an example, and various modifications can be made without departing from the gist of the invention. The present invention naturally encompasses an appropriate modification maintaining the gist of the invention. At least one of omission, replacement, and modification of components can be performed without departing from the gist of the embodiments and the modifications described above.

What is claimed is:

1. A display device comprising:
   a first substrate;
   a second substrate opposed to the first substrate;
   a display functional layer arranged between the first substrate and the second substrate to display an image in a display region;
   a first electrode layer that is arranged in the display region of the second substrate and includes a plurality of first electrodes for detecting contact or proximity of an external object;
   a second electrode arranged between the first substrate and the second substrate to be opposed to the first electrodes;
   a plurality of third electrodes that are arranged between the first substrate and the second substrate and receive a pixel signal; and
   an insulating layer covering the first electrode layer, wherein
   in the insulating layer, a relative dielectric constant of a portion superimposed on the first electrodes is different from a relative dielectric constant of a portion not superimposed on the first electrodes at least in the display region,
   the insulating layer including a first insulating layer having a first relative dielectric constant and a second insulating layer having a second relative dielectric constant larger than the first relative dielectric constant,
   contact or proximity of the external object is detected based on a change in capacitance generated between the first electrodes and the second electrode, and
   in the insulating layer, the first insulating layer is arranged at a portion superimposed on the first electrodes and the second insulating layer is arranged at a portion not superimposed on the first electrodes,
   a distance from an upper surface of the first insulating layer to an upper surface of the second substrate is substantially constant and substantially the same as a distance from an upper surface of the second insulating layer to the upper surface of the second substrate.

2. The display device according to claim 1, wherein
   each of the first electrodes is arranged along a first direction, and the plurality of first electrodes are arranged in a second direction intersecting with the first direction,
   a dummy electrode not functioning as an electrode for detection is arranged between the first electrodes, and
   in the insulating layer, the second insulating layer is arranged at a portion superimposed on the dummy electrode.

3. The display device according to claim 2, further comprising:
   a connecting part that connects ends of the first electrodes to each other, wherein
   in the insulating layer, the first insulating layer is arranged at a position superimposed on the connecting part.

4. The display device according to claim 1, further comprising:
   wiring that is coupled to the first electrodes and arranged in a frame region outside the display region, wherein
   in the insulating layer, the first insulating layer is arranged at a portion superimposed on the wiring.

5. A display device comprising:
   a first substrate;
   a second substrate opposed to the first substrate;
   a display functional layer arranged between the first substrate and the second substrate to display an image in a display region;
   a first electrode layer that is arranged in the display region of the second substrate and includes a plurality of first electrodes for detecting contact or proximity of an external object;
   a second electrode arranged between the first substrate and the second substrate to be opposed to the first electrodes;
   a plurality of third electrodes that are arranged between the first substrate and the second substrate and receive a pixel signal; and
   an insulating layer covering the first electrode layer, wherein
   in the insulating layer, a relative dielectric constant of a portion superimposed on the first electrodes is different from a relative dielectric constant of a portion not superimposed on the first electrodes at least in the display region,
   the insulating layer including a first insulating layer having a first relative dielectric constant and a second insulating layer having a second relative dielectric constant larger than the first relative dielectric constant,
   contact or proximity of the external object is detected based on a change in capacitance generated between the first electrodes and the external object,
   in the insulating layer, the second insulating layer is arranged at a portion superimposed on the first electrodes and the first insulating layer is arranged at a portion not superimposed on the first electrodes, and
   a distance from an upper surface of the first insulating layer to an upper surface of the second substrate is substantially constant and substantially the same as a distance from an upper surface of the second insulating layer to the upper surface of the second substrate.

6. The display device according to claim 5, wherein
   the first electrodes are arranged in the display region,
   coupling wiring coupled to the first electrodes is arranged between the first electrodes, and
   in the insulating layer, the first insulating layer is arranged at a portion superimposed on the coupling wiring.

7. The display device according to claim 1, further comprising:
   an overcoat layer is disposed between an upper surface side of the second substrate and a polarizing layer and arranged continuously on the first insulating layer and the second insulating layer, wherein
   the first relative dielectric constant of the first insulating layer is smaller than a relative dielectric constant of the overcoat layer, and the second relative dielectric constant of the second insulating layer is equal to or larger than a relative dielectric constant of the overcoat layer.

8. The display device according to claim 1, wherein the first relative dielectric constant of the first insulating layer is smaller than 3.5, and the second relative dielectric constant of the second insulating layer is equal to or larger than 3.5.

9. The display device according to claim 8, wherein the first insulating layer includes any of polysiloxane, poly silazane, acrylic, polycarbonate, polyethylene terephthalate, and a fluorine-doped silicon dioxide, and the second insulating layer is a resin material including a silicon dioxide, a silicon nitride, an aluminium oxide, a zirconium oxide, or another metal oxide.

10. The display device according to claim 1, wherein a fringe electric field is generated between the drive electrode and the first electrode and passes through the second insulating layer disposed between the first electrodes to reach the external object.

11. The display device according to claim 5, wherein an electric line of force of an electric field passing through the second insulating layer reaches a farther upward position than an electric line of force of the electric field passing through the first insulating layer.

* * * * *